(12) United States Patent
Hori et al.

(10) Patent No.: US 9,818,718 B2
(45) Date of Patent: Nov. 14, 2017

(54) CONDUCTIVE PASTE AND DIE BONDING METHOD

(71) Applicant: KAKEN TECH CO., LTD., Osaka (JP)

(72) Inventors: Shigeo Hori, Osaka (JP); Hirohiko Furui, Shiga (JP); Akira Fujita, Shiga (JP)

(73) Assignee: KAKEN TECH CO., LTD., Osaka (JP)

( * ) Notice: Subject to any disclaimer, the term of this patent is extended or adjusted under 35 U.S.C. 154(b) by 278 days.

(21) Appl. No.: 14/394,347

(22) PCT Filed: Aug. 20, 2013

(86) PCT No.: PCT/JP2013/072132
§ 371 (c)(1),
(2) Date: Oct. 14, 2014

(87) PCT Pub. No.: WO2014/069074
PCT Pub. Date: May 8, 2014

(65) Prior Publication Data
US 2015/0115018 A1    Apr. 30, 2015

(30) Foreign Application Priority Data

Oct. 30, 2012  (JP) ................. 2012-238508

(51) Int. Cl.
*B22F 1/02* (2006.01)
*H01L 23/00* (2006.01)
(Continued)

(52) U.S. Cl.
CPC ............ *H01L 24/83* (2013.01); *B22F 1/0051* (2013.01); *B22F 1/0062* (2013.01); *B22F 1/0074* (2013.01); *B23K 1/0008* (2013.01); *B23K 1/0016* (2013.01); *B23K 31/12* (2013.01); *B23K 35/025* (2013.01); *B23K 35/3006* (2013.01); *B23K 35/3613* (2013.01); *H01B 1/22* (2013.01); *H01L 24/29* (2013.01); *B22F 9/24* (2013.01); *H01L 24/05* (2013.01); *H01L 24/27* (2013.01); *H01L 24/32* (2013.01); *H01L 2224/04026* (2013.01); *H01L 2224/05639* (2013.01); *H01L 2224/2732* (2013.01); *H01L 2224/27312* (2013.01); *H01L 2224/27318* (2013.01); *H01L 2224/27416* (2013.01); *H01L 2224/2939* (2013.01); *H01L 2224/2949* (2013.01); *H01L 2224/29294* (2013.01); *H01L 2224/29339* (2013.01); *H01L 2224/29387* (2013.01); *H01L 2224/29395* (2013.01); *H01L 2224/29439* (2013.01); *H01L 2224/29499* (2013.01); *H01L 2224/32227* (2013.01); *H01L 2224/32245* (2013.01); *H01L 2224/8321* (2013.01); *H01L 2224/8323* (2013.01); *H01L 2224/83055* (2013.01); *H01L 2224/83075* (2013.01); *H01L 2224/8384* (2013.01); *H01L 2224/83191* (2013.01); *H01L 2224/83192* (2013.01); *H01L 2224/83203* (2013.01); *H01L 2224/83439* (2013.01); *H01L 2924/01047* (2013.01); *H01L 2924/12042* (2013.01); *H01L 2924/12044* (2013.01); *H01L 2924/15747* (2013.01);
(Continued)

(58) Field of Classification Search
None
See application file for complete search history.

(56) References Cited

U.S. PATENT DOCUMENTS

| 2006/0038304 A1* | 2/2006 | Osako | ............... H01L 24/29 257/789 |
| 2007/0185243 A1* | 8/2007 | Terada | ............... C08G 59/42 523/457 |
| 2009/0236404 A1* | 9/2009 | Yamakawa | ............ B22F 1/004 228/123.1 |

FOREIGN PATENT DOCUMENTS

| CN | 101272135 A | 9/2008 |
| EP | 1609547 A1 | 12/2005 |

(Continued)

OTHER PUBLICATIONS

European Search Report, dated Mar. 1, 2016, for European Application No. 13852170.3.
(Continued)

*Primary Examiner* — Jessee Roe
*Assistant Examiner* — Ngoclan T Mai
(74) *Attorney, Agent, or Firm* — Fitch, Even, Tabin & Flannery, LLP

(57) ABSTRACT

Provided are: a conductive paste in which sinterability of silver particles the conductive paste can be easily controlled by using silver particles having predetermined crystal transformation characteristics defined by an XRD analysis, and after a sintering treatment, excellent electrical conductivity and thermal conductivity can be stably obtained; and a die bonding method using the conductive paste.

Disclosed is a conductive paste which includes silver particles having a volume average particle size of 0.1 to 30 μm as a sinterable conductive material, and a dispersing medium for making a paste-like form, and in which when the integrated intensity of the peak at 2θ=38°±0.2° in the x-ray diffraction chart obtainable by an XRD analysis before a sintering treatment of the silver particles is designated as S1, and the integrated intensity of the peak at 2θ=38°±0.2° in the X-ray diffraction chart obtainable by an XRD analysis after a sintering treatment (250° C., 60 minutes) of the silver particles is designated as S2, the value of S2/S1 is adjusted to a value within the range of 0.2 to 0.8.

8 Claims, 20 Drawing Sheets

(51) Int. Cl.
*H01B 1/22* (2006.01)
*B23K 1/00* (2006.01)
*B23K 31/12* (2006.01)
*B23K 35/30* (2006.01)
*B23K 35/36* (2006.01)
*B22F 1/00* (2006.01)
*B23K 35/02* (2006.01)
*B22F 9/24* (2006.01)

(52) U.S. Cl.
CPC ............ *H01L 2924/15787* (2013.01); *H01L 2924/15788* (2013.01); *H01L 2924/2011* (2013.01); *H01L 2924/20106* (2013.01); *H01L 2924/20107* (2013.01); *H01L 2924/20108* (2013.01); *H01L 2924/20109* (2013.01)

(56) References Cited

FOREIGN PATENT DOCUMENTS

| | | |
|---|---|---|
| EP | 2796231 A1 | 10/2014 |
| JP | 2006-097086 A | 4/2006 |
| JP | 2006-237124 A | 9/2006 |
| JP | 2008-88453 A | 4/2008 |
| JP | 2008-091250 A | 4/2008 |
| JP | 2009-046708 A | 3/2009 |
| JP | 4347381 B2 | 7/2009 |
| JP | 2009-289745 A | 12/2009 |
| JP | 2010-36481 A | 2/2010 |
| JP | 2010-53377 A | 3/2010 |
| JP | 2011-129335 A | 6/2011 |
| JP | 2012-036481 A | 2/2012 |
| JP | 2012-251208 | * 12/2012 |
| TW | 200703373 A | 1/2007 |

OTHER PUBLICATIONS

Jianhui Zhang et al., "A facile colloidal templating method to monodisperse hollow Ag and Ag/Au submicrometer spheres", Materials Letters, pp. 280-283, 2006, vol. 60, Issue 2.
"Industrial Aqueous Ammonia—Industrial Aqueous Ammonia Manufacturers, Suppliers and Exporters on Alibaba.comAlkali", http://www.alibaba.com/products/F0/industrial_aqueous_ammonia/[ . . . ].
"Ammonium hydroxide", XP 552523927A, wikipedia.
"Formaldehyde solution", http://www.sigmaaldrich.com/catalog/product/sial/252549[ . . . ].
Kazuhiro Honda, Formation of Ag Particles by Microwave Heating of a AgNO3/GlycerinSolution, Bunseki Kagaku 2005, pp. 1003-1005, vol. 54, No. 10.

* cited by examiner

CONDUCTIVE PASTE AND DIE BONDING METHOD

TECHNICAL FIELD

The present invention relates to a conductive paste and a die bonding method.

More particularly, the invention relates to a conductive paste in which sinterability of silver particles can be easily controlled by using silver particles having predetermined crystal transformation characteristics that are defined by an XRD analysis, and after a sintering treatment, excellent electrical conductivity and thermal conductivity can be stably obtained; and to a die bonding method using the conductive paste.

BACKGROUND ART

Various conductive pastes for die bonding containing silver particles, and various die bonding methods for semiconductor devices using the conductive pastes have been hitherto suggested.

For example, a paste-like silver composition for adhesion of metal-based adherends, which is sintered by heating and is thereby converted to solid silver having excellent strength, electrical conductivity and thermal conductivity, has been suggested (see Patent Document 1).

More specifically, disclosed is a paste-like silver composition for bonding between metal-based adherends, which includes (A) spherical silver particles produced by a reducing method, having an average particle size of 0.1 to 6 μm and a carbon content of 0.50% by weight or less; and (B) a volatile dispersing medium having a boiling point of 70° C. to 250° C. and selected from water, volatile monohydric alcohols, volatile aliphatic hydrocarbons, volatile ketones, volatile lower aliphatic carboxylic acid esters, and volatile silicone oils, characterized in that when the paste-like composition is heated to a temperature of from 100° C. to 250° C., the volatile dispersing medium is volatilized, and thereby the spherical silver particles are sintered and are converted to solid silver having a volume resistivity of $1 \times 10^{-4}$ Ω·cm or less and a thermal conductivity of 5 W/m·K or more.

Furthermore, there has been suggested a method of forming a hot sintered product with fewer cracks by controlling the sinterability of particles, and thereby strongly bonding metal-based adherends with each other (see Patent Document 2).

More specifically, disclosed is a method for bonding metallic members, characterized by inserting a paste-like metal particle composition including (A) hot sinterable metal particles having an average particle size of above 0.1 μm and 50 μm or less, and (B) a volatile dispersing medium, between plural metallic members, volatilizing the volatile dispersing medium (B) in the paste-like metal particle composition in an amount of 10% by weight or more but below 100% by weight by heating in an inert gas at a temperature of from 40° C. to 200° C., subsequently volatilizing the volatile dispersing medium (B) remaining in the paste-like metal particle composition by heating in an oxidizing gas or a reducing gas at a temperature of from 70° C. to 400° C., thus sintering the hot sinterable metal particles (A), and thereby bonding the plural metallic members.

Furthermore, there has been suggested a paste-like silver particle composition in which silver particles are easily sintered when the composition is heated while eliminating the influence of long-chain fatty acids and the like that cover the surface of hot sinterable metal particles, and are thereby converted to solid silver having excellent strength, electrical conductivity and thermal conductivity (see Patent Document 3).

More specifically, disclosed is a paste-like silver particle composition including (A) silver particles having their surface covered with long- and medium-chain fatty acids (b1) or derivatives (b2) of long- and medium-chain fatty acids (b1), and (B) a volatile dispersing medium, in which the volatile dispersing medium is volatilized by heating and thereby the silver particles are sintered, characterized in that the long- and medium-chain fatty acids (b1) or the derivatives (b2) of long- and medium-chain fatty acids (b1) that cover the silver particle surface, are products obtained by replacing the long-chain fatty acids (a1) or derivatives (a2) of long-chain fatty acids (a1) that have been previously covering the silver particle surface, with long- and medium-chain fatty acids (b1) or derivatives (b2) of long- and medium-chain fatty acids (b1) that are shorter than the long-chain fatty acids (a1).

Furthermore, there have been suggested flat silver particles that have enhanced orientation properties when used to form a conductor film, so that a low resistant conductor film may be obtained therefrom (see Patent Document 4).

More specifically, disclosed are flat silver particles characterized in that the ratio $P_{200}/P_{111}$ of the peak $P_{200}$ of a (200) plane with respect to the peak $P_{111}$ of a (111) plane, which is obtained by an XRD analysis, is 0.3 or less.

CITATION LIST

Patent Document

Patent Document 1: Japanese Patent No. 4347381 (claims and the like)
Patent Document 2: JP 2010-53377 A (claims)
Patent Document 3: JP 2009-289745 A (claims)
Patent Document 4: JP 2012-36481 A (claims)

DISCLOSURE OF THE INVENTION

Problem to be Solved by the Invention

However, in regard to the paste-like silver compositions and the like disclosed in Patent Documents 1 to 4, since nothing is taken into consideration on the crystal transformation characteristics obtainable before and after a sintering treatment of metal particles as a sinterable conductive material, there is a problem that sinterability of the metal particles in the interior of the paste-like silver compositions and the like may not be stably controlled.

That is, since metal particles have diverse crystal transformation characteristics when subjected to a sintering treatment, due to various factors such as the production method of the metal particles and the like, there is a problem that even if the state of the metal particles before the sintering treatment, or the conditions for the sintering treatment are regulated as in the case of Patent Documents 1 to 4, eventually sinterability of the metal particles may not be controlled depending on the kind of the metal particles, and desired electrical conductivity or thermal conductivity may not be stably obtained.

In addition to that, the paste-like silver composition for adhesion of metal-based adherends disclosed in Patent Document 1 has a problem in terms of production, that the carbon content derived from the coating material covering the spherical silver particles should be strictly controlled to a value of 0.50% by weight or less.

Furthermore, it is disclosed to the effect that such a carbon content should be controlled by subjecting the spherical silver particles to a washing treatment. However, since it is difficult to wash the coating material uniformly, the washing process may not be quantitatively managed, and as a result, there is a problem that sinterability of the silver particles may not be stably controlled.

Furthermore, the paste-like silver composition disclosed in Patent Document 2 has a problem in terms of production that the metal particles (silver particles, copper particles or the like) used should be heat treated at a predetermined temperature (40° C. to 200° C.) in an inert gas so as to volatilize the volatile dispersing medium, and then should be heat treated at a predetermined temperature (70° C. to 400° C.) in an oxidizing gas or in a reducing gas.

Furthermore, sine it is difficult to uniformly volatilize the volatile dispersing medium in an inert gas, the volatilization process may not be quantitatively managed, and as a result, there is a problem that sinterability of the metal particles still may not be stably controlled.

Furthermore, the paste-like silver composition disclosed in Patent Document 3 has a problem in terms of production that the long- or medium-chain fatty acids covering the surface of the silver particles used should be replaced by long- and medium-chain fatty acids that are shorter than the former fatty acids.

Moreover, it is disclosed as a method for replacement to immerse silver particles covered with long- and medium-chain fatty acids, in long- and medium-chain fatty acids that are shorter than the former fatty acids. However, since it is difficult to achieve uniform replacement, the replacement process may not be quantitatively managed, and as a result, there is a problem that sinterability of silver particles still may not be stably controlled.

In addition, a paste-like silver composition and the like containing the flat silver particles disclosed in Patent Document 4 have a problem in terms of production that on the occasion of producing predetermined flat silver particles, while carboxylic acids, amines or thiols are co-present in an aqueous solution containing a water-soluble silver compound, a reducing agent should be added several times to an aqueous solution that has been heated to 60° C. or higher.

Thus, the inventors of the present invention conducted extensive investigations, and as a result, they found that when silver particles having a predetermined particle size and having predetermined crystal transformation characteristics that are defined by an XRD analysis are used as a sinterable conductive material, and a dispersing medium for making a paste-like form is included, control of the sinterability of the silver particles is facilitated. Thus, the inventors completed the present invention.

That is, an object of the present invention is to provide a conductive paste in which sinterability of the silver particles can be easily controlled without being dependent on the crystallinity of the silver particles before a sintering treatment, and excellent electrical conductivity and thermal conductivity are stably obtainable after a sintering treatment, and a die bonding method using the conductive paste.

Meanwhile, the "crystallinity of silver particles before a sintering treatment" described above means the integrated intensities, peak heights, full widths at half maximum, and the like of various peaks in the X-ray diffraction chart of silver particles before a sintering treatment.

Means for Solving Problem

According to an aspect of the present invention, there is provided a conductive paste including silver particles having a volume average particle size of 0.1 to 30 µm as a sinterable conductive material, and a dispersing medium for making a paste-like form, characterized in that when the integrated intensity of the peak at $2\theta=38°\pm0.2°$ in the X-ray diffraction chart of silver particles obtainable by an XRD analysis before a sintering treatment is designated as S1, and the integrated intensity of the peak at $2\theta=38°\pm0.2°$ in the X-ray diffraction chart of silver particles obtainable by an XRD analysis after a sintering treatment (250° C., 60 minutes) is designated as S2, the value of S2/S1 is adjusted to a value within the range of 0.2 to 0.8. Thus, the problems described above can be solved.

That is, according to the conductive paste of the present invention, when silver particles having a predetermined particle size and having predetermined crystal transformation characteristics that are defined by an XRD analysis are used as a sinterable conductive material, sinterability of the silver particles in the conductive paste can be easily controlled without being dependent on the crystallinity of the silver particles before a sintering treatment, and after a sintering treatment, excellent electrical conductivity and thermal conductivity can be stably obtained.

Furthermore, on the occasion of configuring the conductive paste of the present invention, when the peak height of a peak at $2\theta=38°\pm0.2°$ in the X-ray diffraction chart obtainable by an XRD analysis before a sintering treatment of the silver particles is designated as L1, and the peak height of the peak at $2\theta=38°\pm0.2°$ in the X-ray diffraction chart obtainable by an XRD analysis after sintering (250° C., 60 minutes) of the silver particles is designated as L2, it is preferable to adjust the value of L2/L1 to a value within the range of 0.5 to 1.5.

When such a configuration is adopted, the crystal transformation characteristics of the silver particles become more suitable, and sinterability of the silver particles in the conductive paste can be more easily controlled.

Furthermore, on the occasion of configuring the conductive paste of the present invention, when the full width at half maximum of the peak at $2\theta=38°\pm0.2°$ in the X-ray diffraction chart obtainable by an XRD analysis before a sintering treatment of the silver particles is designated as W1, and the full width at half maximum of the peak at $2\theta=38°\pm0.2°$ in the X-ray diffraction chart obtainable by an XRD analysis after a sintering treatment (250° C., 60 minutes) of the silver particles is designated as W2, it is preferable to adjust the value of W2/W1 to a value within the range of 0.3 to 0.9.

When such a configuration is adopted, the crystal transformation characteristics of the silver particles become more suitable, and sinterability of the silver particles in the conductive paste can be more easily controlled.

Furthermore, on the occasion of configuring the conductive paste of the present invention, it is preferable that the silver particles are hollow silver particles.

When such a configuration is adopted, sinterability of the silver particles in the conductive paste can be controlled more easily, and also, the configuration can contribute to weight reduction of the conductive paste and cost reduction.

Furthermore, on the occasion of configuring the conductive paste of the present invention, it is preferable that the surface of the silver particles is coated by an organic surface treating agent formed from at least one selected from an organic acid, an organic acid salt, a surfactant, and a coupling agent.

When such a configuration is adopted, the crystal transformation characteristics of the silver particles can be regulated, and further, sinterability of the silver particles in the conductive paste can be controlled more easily.

On the occasion of configuring the conductive paste of the present invention, it is preferable to adjust the amount of incorporation of the dispersing medium to a value within the range of 5 to 30 parts by weight relative to 100 parts by weight of the silver particles.

When such a configuration is adopted, appropriate viscosity can be imparted to the conductive paste while sinterability of the silver particles in the conductive paste is stably maintained.

On the occasion of configuring the conductive paste of the present invention, it is preferable that the dispersing medium is at least one compound selected from the group consisting of a glycol ether-based compound, a glycol ester-based compound, a hydrocarbon-based compound, and a polar solvent.

When such a configuration is adopted, appropriate viscosity can be imparted to the conductive paste while sinterability of the silver particles in the conductive paste is more stably maintained.

Furthermore, on the occasion of configuring the conductive paste of the present invention, it is preferable for the conductive paste to further include an organic compound, and also to adjust the amount of incorporation of the organic compound to a value within the range of 0.5 to 10 parts by weight relative to 100 parts by weight of the silver particles.

When such a configuration is adopted, stability over time of the sintered silver particles can be enhanced while sinterability of the silver particles in the conductive paste is stably maintained.

Also, on the occasion of configuring the conductive paste of the present invention, it is preferable that the organic compound is a thermosettable resin including at least one of an epoxy-based resin and a phenolic resin.

When such a configuration is adopted, stability over time of the sintered silver particles can be enhanced while sinterability of the silver particles in the conductive paste is more stably maintained.

According to another aspect of the present invention, there is provided a die bonding method including a step of applying, on a predetermined site on a substrate for mounting a semiconductor device, a conductive paste which contains silver particles having a volume average particle size of 0.1 to 30 μm as a sinterable conductive material, and a dispersing medium for making a paste-like form, and in which when the integrated intensity of the peak at 2θ=38°±0.2° in the X-ray diffraction chart obtainable by an XRD analysis before a sintering treatment of the silver particles is designated as S1, and the integrated intensity of the peak at 2θ=38°±0.2° in the X-ray diffraction chart obtainable by an XRD analysis after a sintering treatment (250° C., 60 minutes) of the silver particles is designated as S2, the value of S2/S1 is adjusted to a value within the range of 0.2 to 0.8; and a step of heating the conductive paste under the conditions of a temperature of 200° C. to 450° C. to sinter the silver particles, and thereby mounting the semiconductor device on the substrate.

That is, according to the die bonding method of the present invention, a semiconductor device can be stably mounted on a substrate by using a predetermined conductive paste, while allowing the conductive paste to exhibit excellent electrical conductivity and thermal conductivity.

MODE(S) FOR CARRYING OUT THE INVENTION

First Exemplary Embodiment

Figure 1A:
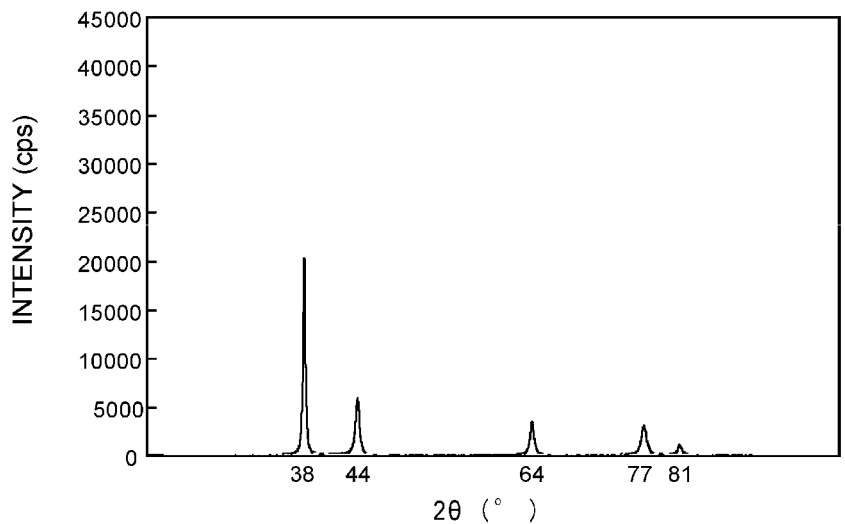
FIGS. 1(a) and 1(b) are XRD spectrum charts of silver particles in Example 1.

A first exemplary embodiment relates to a conductive paste including silver particles having a volume average particle size of 0.1 to 30 μm as a sinterable conductive material, and a dispersing medium for making a paste-like form, characterized in that when the integrated intensity of the peak at 2θ=38°±0.2° in the X-ray diffraction chart obtainable by an XRD analysis before a sintering treatment of the silver particles is designated as S1, and the integrated intensity of the peak at 2θ=38°±0.2° in the X-ray diffraction chart obtainable by an XRD analysis after a sintering treatment (250° C., 60 minutes) of the silver particles is designated as S2, the value of S2/S1 is adjusted to a value within the range of 0.2 to 0.8.

Hereinafter, the conductive paste of the first exemplary embodiment will be specifically explained, separately for the respective constituent elements.

1. Silver Particles (1) Volume Average Particle Size

The present invention is characterized by adjusting the volume average particle size of the silver particles as a sinterable conductive material to a value within the range of 0.1 to 30 μm.

The reason for this is that if the volume average particle size of such silver particles has a value of below 0.1 μm, the silver particles are prone to aggregate, and handleability may be excessively decreased. On the other hand, it is because if the volume average particle size of such silver particles has a value of above 30 μm, sinterability may be markedly decreased, or paste formation may be difficult.

Therefore, it is more preferable to adjust the volume average particle size of the silver particles to a value within the range of 0.5 to 15 μm, and even more preferably to a value within the range of 1.5 to 5 μm.

Meanwhile, the volume average particle size can be measured using a laser diffraction scattering type particle size distribution analyzer, can be actually measured from electron microscopic photographs, or can also be calculated using an image processing apparatus from the electron microscopic photographs.

(2) Morphology

Furthermore, the morphology of the silver particles is not particularly limited, and may be a spherical shape, an elliptical shape, a cubic shape, a rod shape, a close-cropped shape, a flake shape, a heteromorphic shape, or a combination thereof.

Also, in regard to the morphology of the silver particles, hollow silver particles having a predetermined cavity in the interior are more preferred.

The reason for this is that when such hollow silver particles are used, sinterability of the silver particles in the conductive paste can be more easily controlled, and also, the use of hollow silver particles can contribute to weight reduction of the conductive paste and cost reduction.

(3) Bulk Density

Furthermore, it is preferable to adjust the bulk density of the silver particles to a value within the range of 0.5 to 8 g/cm$^3$.

The reason for this is that if the bulk density of such silver particles has a value of below 0.5 g/cm$^3$, the tensile strength after the silver particles are sintered in the conductive paste is decreased, and cracks are prone to be generated. On the other hand, it is because if the bulk density of such silver particles has a value of above 8 g/cm$^3$, it may be difficult to stably control the sinterability in the conductive paste.

Therefore, it is more preferable to adjust the bulk density of the silver particles to a value within the range of 2 to 7 g/cm$^3$, and even more preferably to a value within the range of 4 to 6 g/cm$^3$.

Meanwhile, the bulk density of such silver particles can be measured according to the tapping method of JIS K5101.

(4) Surface Coating

Furthermore, it is preferable that the surface of the silver particles is covered by at least one organic surface treating agent selected from an organic acid, an organic acid salt, a surfactant, and a coupling agent.

The reason for this is that when the surface of the silver particles is covered by such an organic surface treating agent, the crystal transformation characteristics of the silver particles can be regulated, and also, sinterability of the silver particles in the conductive paste can be controlled more easily.

(4)-1 Kind

Furthermore, the kind of such an organic surface treating agent is not particularly limited, but usually, examples thereof include monobasic acids such as hexanoic acid, 2-ethylhexanoic acid, octanoic acid, decanoic acid, lauric acid, myristic acid, palmitic acid, stearic acid, behenic acid, montanic acid, oleic acid, linolic acid, linoleic acid, 12-hydroxystearic acid, benzoic acid, gluconic acid, cinnamic acid, salicylic acid, gallic acid, pentadecanoic acid, heptadecanoic acid, arachidic acid, lignoceric acid, cerotic acid, 2-pentylnonanoic acid, 2-hexyldecanoic acid, 2-heptyldodecanoic acid, isostearic acid, palmitoleic acid, isooleic acid, elaidic acid, ricinoleic acid, gadoleic acid, erucic acid, and selacholeic acid; and dibasic acids such as malonic acid, succinic acid, glutaric acid, adipic acid, pimellic acid, suberic acid, azelaic acid, malic acid, phthalic acid, and fumaric acid, which may be used singly or in combination of two or more kinds thereof.

(4)-2 Amount of Incorporation

Furthermore, the amount of incorporation of the organic surface treating agent is preferably adjusted to a value within the range of 0.1 to 3 parts by weight relative to 100 parts by weight of the silver particles.

The reason for this is that when the amount of incorporation of the organic surface treating agent is adjusted as such, the crystal transformation characteristics of the silver particles can be regulated, and also, sinterability of the silver particles in the conductive paste can be controlled more easily.

That is, it is because if the amount of incorporation of the organic surface treating agent has a value of below 0.1 parts by weight, the silver particles are prone to aggregate with each other. On the other hand, it is because if the amount of incorporation of the organic surface treating agent has a value of above 3 parts by weight, satisfactory sinterability may not be obtained.

Therefore, it is more preferable to adjust the amount of incorporation of the organic surface treating agent to a value within the range of 0.5 to 2.5 parts by weight, and even more preferably to a value within the range of 1 to 2 parts by weight, relative to 100 parts by weight of the silver particles.

(4)-3 Amount of Carbon

Furthermore, it is preferable to adjust the carbon content relative to the total amount (100% by weight) of the silver particles to a value within the range of 0.05% to 3% by weight.

The reason for this is that if such carbon content has a value of below 0.05% by weight, the silver particles are prone to aggregate with each other. On the other hand, it is because if such carbon content has a value of above 3% by weight, satisfactory sinterability may not be obtained.

Therefore, it is more preferable to adjust the carbon content with respect to the silver particles (100% by weight) to a value within the range of 0.1% to 2% by weight, and even more preferably to a value within the range of 0.55% to 1% by weight.

(5) XRD Analysis (5)-1 Integrated Intensity Ratio

Furthermore, the present invention is characterized in that when the integrated intensity of the peak at $2\theta=38°\pm0.2°$ in the X-ray diffraction chart obtainable by an XRD analysis before a sintering treatment of the silver particles is designated as S1, and the integrated intensity of the peak at $2\theta=38°\pm0.2°$ in the X-ray diffraction chart obtainable by an XRD analysis after a sintering treatment (250° C., 60 minutes) of the silver particles is designated as S2, the value of S2/S1 is adjusted to a value within the range of 0.2 to 0.8.

The reason for this is that when silver particles having such predetermined crystal transformation characteristics are used, sinterability of the silver particles in the conductive paste can be easily controlled without being dependent on the crystallinity of the silver particles before a sintering treatment, and after the sintering treatment, excellent electrical conductivity and thermal conductivity can be stably obtained.

That is, it is because if such an integrated intensity ratio has a value of below 0.2, durable thermal conductivity after the sintering treatment may be excessively decreased. On the other hand, it is because if such an integrated intensity ratio has a value of above 0.8, electrical conductivity after the sintering treatment may be decreased, and the specific resistance may be excessively increased.

Therefore, when the integrated intensity of the peak at $2\theta=38°\pm0.2°$ in the X-ray diffraction chart obtainable by an XRD analysis before a sintering treatment of the silver particles is designated as S1, and the integrated intensity of the peak at $2\theta=38°\pm0.2°$ in the X-ray diffraction chart obtainable by an XRD analysis after a sintering treatment (250° C., 60 minutes) of the silver particles is designated as S2, it is more preferable to adjust the value of S2/S1 to a value within the range of 0.25 to 0.75, and even more preferably to a value within the range of 0.3 to 0.7.

Meanwhile, the sintering treatment for performing an XRD analysis of silver particles after a sintering treatment according to the present invention means that silver particles in a state that additives such as a dispersing medium are not included therein, are screened on a glass plate surface through a 100-mesh sieve so as to prevent the silver particles from overlapping one another, and are sintered by heating for 60 minutes in a circulating air dryer under the conditions of 250° C.

Therefore, in a sintering treatment for performing an XRD analysis of silver particles that have been subjected to a sintering treatment, since the individual silver particles are still particulate even after the sintering treatment, the silver particles can be accommodated in a cell and submitted to an XRD analysis.

On the other hand, when it is said that a conductive paste is subjected to a sintering treatment, it is meant that silver particles in the conductive paste are brought to a state of being molten and partially connected with each other.

Here, an outline of the relationship between the X-ray diffraction chart obtainable by an XRD analysis before a sintering treatment of silver particles, and the crystal characteristics of the silver particles, will be explained.

Figure 1B:
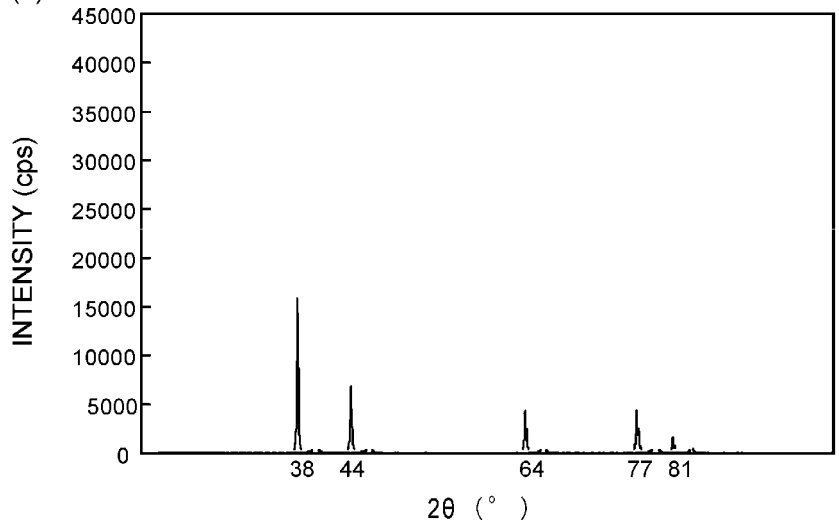

That is, FIG. 1(a) shows the XRD spectrum chart obtainable before a sintering treatment of silver particles in Example 1 of the present invention, and FIG. 1(b) shows the XRD spectrum chart obtained after a sintering treatment of silver particles in Example 1 of the present invention.

As can be seen from the XRD spectrum charts of FIGS. 1(a) and 1(b) as such, it is known that silver metal usually has a diffraction peak of the (111) plane at $2\theta=38°\pm0.2°$, a diffraction peak of the (200) plane at $2\theta=44°\pm0.2°$, a diffraction peak of the (220) plane at $2\theta=64°\pm0.2°$, a diffraction peak of the (311) plane at $2\theta=77°\pm0.2°$, and a diffraction peak of the (222) plane at $2\theta=81°\pm0.2°$.

It has been confirmed by the inventors of the present invention that these peaks vary widely as the crystal characteristics of silver particles change as a result of a sintering treatment.

In addition to that, it has been confirmed that the characteristics of crystal transformation caused by a sintering treatment, that is, the crystal transformation characteristics, are not primarily determined by the XRD spectrum of silver particles before a sintering treatment and the sintering treatment conditions, but are characteristics potentially carried by various silver particles.

More specifically, it has been confirmed that even if the XRD spectrum of the silver particles before a sintering treatment and the sintering treatment conditions are the same, the crystal characteristics of the silver particles after a sintering treatment vary widely depending on the crystal transformation characteristics potentially carried by the silver particles.

Also, it has been confirmed that even among the various certain crystal transformation characteristics, the integrated intensity ratio S2/S1 of the peak at $2\theta=38°\pm0.2°$ has a clear correlation with the electrical conductivity or thermal conductivity for a conductive paste that has been subjected to a sintering treatment, and thus electrical conductivity or thermal conductivity of a conductive paste that has been subjected to a sintering treatment can be stably controlled by defining such integrated intensity ratio. Thus, the inventors completed the present invention.

That is, the integrated intensity ratios (–) of the peaks at $2\theta=38°\pm0.2°$, $2\theta=44°\pm0.2°$, $2\theta=64°\pm0.2°$, $2\theta=77°\pm0.2°$, and $2\theta=81°\pm0.2°$, which are characteristically exhibited by silver metal, all represent strong correlation with the specific resistance ($\Omega\cdot cm$) for a conductive paste that has been subjected to a sintering treatment; however, it has been confirmed that among these, the integrated intensity ratio of the peak at $2\theta=38°\pm0.2°$ represents the strongest correlation.

More specifically, it has been confirmed that the coefficient of determination $R^2$ between the integrated intensity ratio (–) in the case of $2\theta=38°\pm0.2°$, and the specific resistance ($\Omega\cdot cm$) for a conductive paste that has been subjected to a sintering treatment, is 0.84, which is a very high value.

On the other hand, $R^2$ in the case of $2\theta=44°\pm0.2°$ is 0.79, $R^2$ in the case of $2\theta=64°\pm0.2°$ is 0.80, $R^2$ in the case of $2\theta=77°\pm0.2°$ is 0.68, and $R^2$ in the case of $2\theta=81°\pm0.2°$ is 0.46. It has been confirmed that when these values are compared with the case of $2\theta=38°\pm0.2°$, the values of the coefficient of determination are smaller.

Meanwhile, the coefficient of determination $R^2$ is the square of the coefficient of correlation R, and is a coefficient used as a measure for estimating the accuracy of application of the regression equation (approximation equation).

Furthermore, the reason why the integrated intensity ratio of the peaks at $2\theta=38°\pm0.2°$ and the like have a clear correlation with the electrical conductivity or thermal conductivity for a conductive paste that has been subjected to a sintering treatment, is not clearly understood at the moment. However, it is speculated to be because the progress of the changes induced by a sintering treatment, such as the crystallite size that constitute silver particles of the distribution of the crystal phase, greatly affects per se the conductivity of the silver particles that have been subjected to a sintering treatment.

Next, the relationship between the integrated intensity ratio of the peak at $2\theta=38°\pm0.2°$ obtained before and after a sintering treatment, and the specific resistance will be explained.

Figure 2:
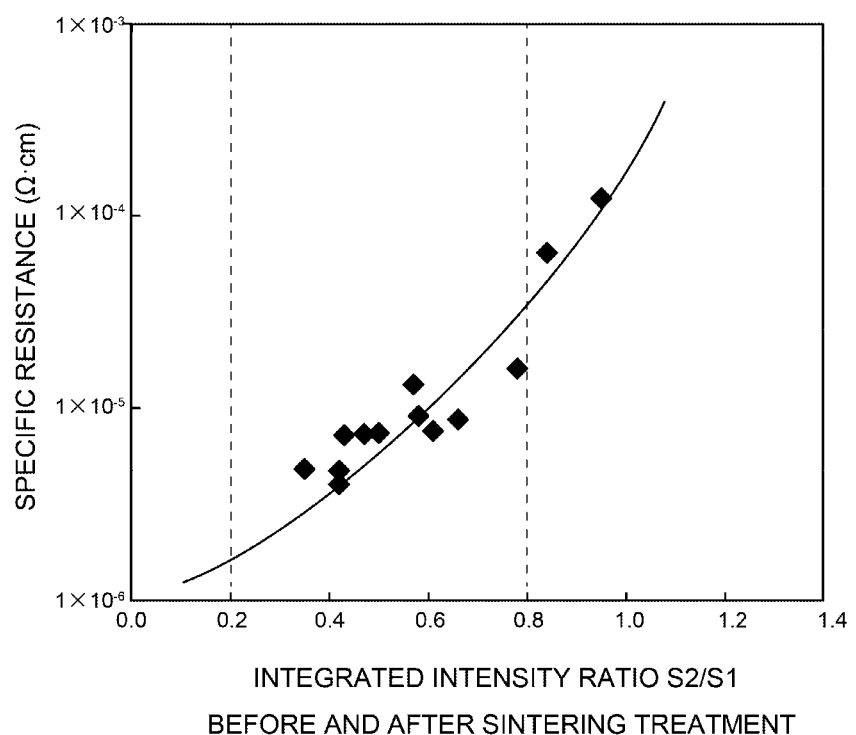
FIG. 2 is a diagram provided to explain the relationship between the integrated intensity ratio of the peak at 2θ=38°±0.2° obtained before and after a sintering treatment, and the specific resistance.

That is, FIG. 2 shows a characteristic curve in which the horizontal axis represents the integrated intensity ratio S2/S1 (–) of the peak at $2\theta=38°\pm0.2°$ obtained before and after a sintering treatment for the silver particles, and the vertical axis represents the specific resistance (Ω·cm) for the conductive paste after a sintering treatment.

Implied from such a characteristic curve is the correlation between the two values that the specific resistance is increased as the integrated intensity ratio is increased.

More specifically, at the time point at which the integrated intensity ratio is 0.2, the specific resistance has a low value such as about $2 \times 10^{-6}$ Ω·cm, and even at the time point at which the integrated intensity ratio is 0.8, the specific resistance is about $2 \times 10^{-5}$ Ω·cm. Thus, electrical conductivity at a level that is free from any problem for practical use is maintained.

On the other hand, it is understood that when the integrated intensity ratio has a value of above 0.8, the specific resistance is proportionally increased, and for example, at the time point at which the integrated intensity ratio is 0.9, the specific resistance acquires a very large value such as about $1 \times 10^{-4}$ Ω·cm, so that electrical conductivity at a level required for practical use may not be obtained.

Therefore, it is construed that in the characteristic curve shown in FIG. 2, the predetermined integrated intensity ratio is adjusted to the range of 0.2 to 0.8, predetermined electrical conductivity may be stably obtained.

(5)-2 Peak Height Ratio

Furthermore, when the peak height of the peak at $2\theta=38°\pm0.2°$ in the X-ray diffraction chart obtainable by an XRD analysis before a sintering treatment of the silver particles is designated as L1, and the peak height of the peak at $2\theta=38°\pm0.2°$ in the X-ray diffraction chart obtainable by an XRD analysis after sintering (250° C., 60 minutes) of the silver particles is designated as L2, it is preferable to adjust the value of L2/L1 to a value within the range of 0.5 to 1.5.

The reason for this is that when the crystal transformation characteristics defined by the integrated intensity ratio is further limited by the peak height ratio, the crystal transformation characteristics of the silver particles become more suitable, and sinterability of the silver particles in the conductive paste can be more easily controlled.

That is, it is because if such peak height ratio has a value of below 0.5, the durable thermal conductivity after a sintering treatment may be excessively decreased.

On the other hand, it is because if such peak height ratio has a value of above 1.5, the electrical conductivity after a sintering treatment is decreased, and the specific resistance may be excessively increased.

Therefore, when the peak height of the peak at $2\theta=38°\pm0.2°$ in the X-ray diffraction chart obtainable by an XRD analysis before a sintering treatment of the silver particles is designated as L1, and the peak height of the peak at $2\theta=38°\pm0.2°$ in the X-ray diffraction chart obtainable by an XRD analysis after sintering (250° C., 60 minutes) of the silver particles is designated as L2, it is more preferable to adjust the value of L2/L1 to a value within the range of 0.6 to 1.4, and it is even more preferable to adjust the value of L2/L1 to a value within the range of 0.7 to 1.2.

Next, the relationship between the peak height ratio of the peak at $2\theta=38°\pm0.2°$ obtained before and after a sintering treatment, and the specific resistance will be explained using FIG. 3.

Figure 3:
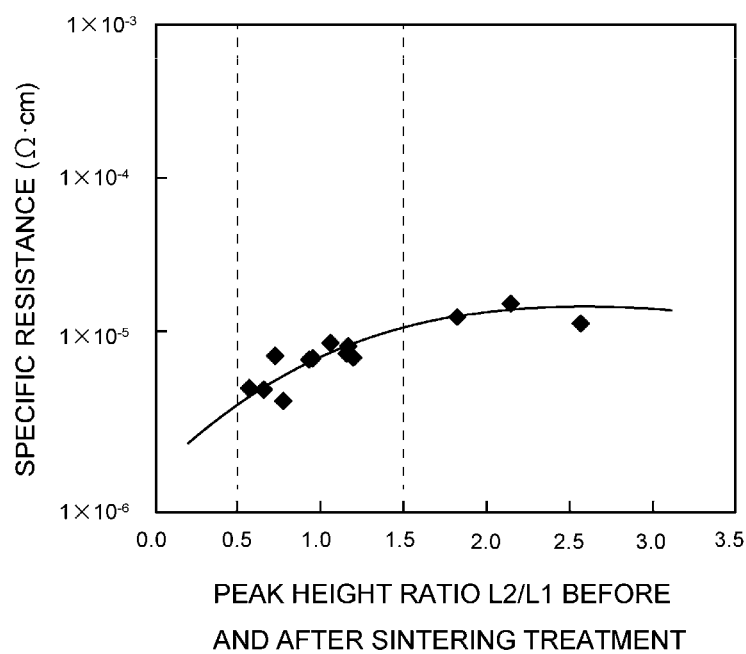
FIG. 3 is a diagram provided to explain the relationship between the peak height ratio of the peaks at 2θ=38°±0.2° obtained before and after a sintering treatment, and the specific resistance.

That is, FIG. 3 shows a characteristic curve in which the horizontal axis represents the peak height ratio L2/L1 (–) of the peak at $2\theta=38°\pm0.2°$ obtained before and after a sintering treatment, and the vertical axis represents the specific resistance (Ω·cm) of the conductive paste after a sintering treatment.

Implied from such a characteristic curve is the correlation between the two values that the specific resistance is increased as the peak height ratio is increased.

More specifically, at the time point at which the peak height ratio is 0.5, the specific resistance has a low value such as about $4 \times 10^{-6}$ Ω·cm, and even at the time point at which the peak height ratio is 1.5, the specific resistance is about $1 \times 10^{-5}$ Ω·cm. Thus, electrical conductivity at a level without any problem for practical use is maintained.

On the other hand, if the peak height ratio has a value of above 1.5, the specific resistance is proportionally increased, and it may be difficult to stably obtain electrical conductivity at a level required for practical use.

Therefore, it is construed that in the characteristic curve shown in FIG. 3, predetermined electrical conductivity is stably obtained by adjusting the predetermined peak height ratio to a value within the range of 0.5 to 1.5.

(5)-3 Full Width at Half Maximum

Furthermore, when the full width at half maximum of the peak at $2\theta=38°\pm0.2°$ in the X-ray diffraction chart obtainable by an XRD analysis before a sintering treatment of the silver particles is designated as W1, and when the full width at half maximum of the peak at $2\theta=38°\pm0.2°$ in the X-ray diffraction chart obtainable by an XRD analysis after a sintering treatment (250° C., 60 minutes) of the silver particles is designated as W2, it is preferable to adjust the value of W2/W1 to a value within the range of 0.3 to 0.9.

The reason for this is that when the crystal transformation characteristics defined by the integrated intensity ratio are further defined by the ratio of the full width at half maximum, the crystal transformation characteristics of the silver particles become more suitable, and sinterability of the silver particles in the conductive paste can be more easily controlled.

That is, it is because if such a ratio of the full width at half maximum has a value of below 0.3, electrical conductivity after a sintering treatment is decreased, and the specific resistance may be excessively increased. On the other hand, it is because even if such a ratio of the full width at half maximum has a value of above 0.9, electrical conductivity after a sintering treatment is decreased, and the specific resistance may be excessively increased.

Therefore, when the full width at half maximum of the peak at $2\theta=38°\pm0.2°$ in the X-ray diffraction chart obtainable by an XRD analysis before a sintering treatment of the silver particles is designated as W1, and when the full width at half maximum of the peak at $2\theta=38°\pm0.2°$ in the X-ray diffraction chart obtainable by an XRD analysis after a sintering treatment (250° C., 60 minutes) of the silver particles is designated as W2, it is more preferable to adjust the value of W2/W1 to a value within the range of 0.2 to 0.8, and even more preferably to a value within the range of 0.4 to 0.7.

Next, the relationship between the ratio of the full width at half maximum of the peak at $2\theta=38°\pm0.2°$ obtained before and after a sintering treatment, and the specific resistance will be explained using FIG. 4.

Figure 4:
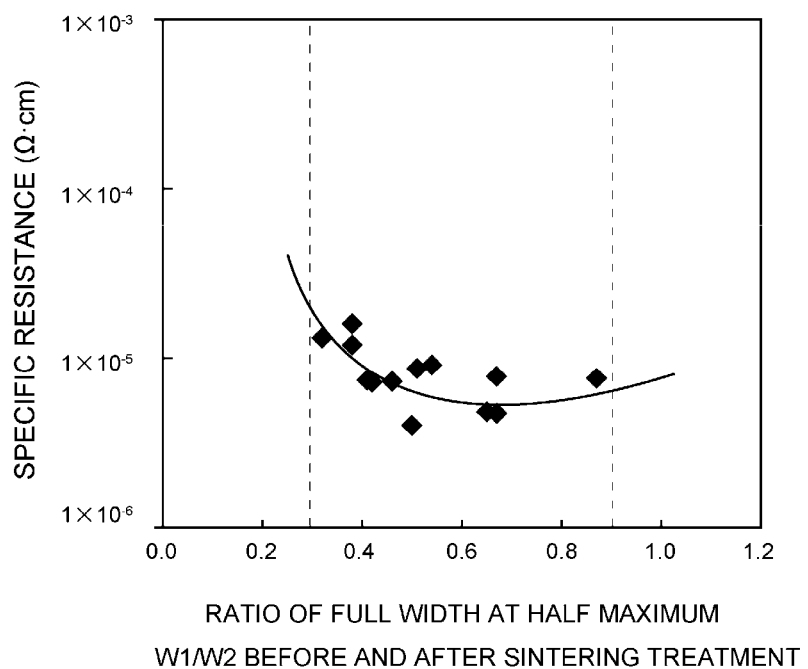
FIG. 4 is a diagram provided to explain the relationship between the ratio of the full widths at half maximum of the peaks at 2θ=38°±0.2° obtained before and after a sintering treatment, and the specific resistance.

That is, FIG. 4 shows a characteristic curve in which the horizontal axis represents the ratio of the full width at half maximum W2/W1 (–) of the peak at $2\theta=38°\pm0.2°$ obtained before and after a sintering treatment, and the vertical axis represents the specific resistance (Ω·cm) of the conductive paste after a sintering treatment.

Implied from such a characteristic curve is the correlation between the two values that the specific resistance is first decreased to the minimum and then increased, as the ratio of the full width at half maximum is increased.

More specifically, for example, it is understood that at the time point at which the ratio of the full width at half maximum is 0.2, the specific resistance acquires a very large value such as about $1 \times 10^{-4}$ Ω·cm, and electrical conductivity at a level required for practical use may not be obtained.

On the other hand, when the ratio of the full width at half maximum has a value of 0.3 or more, the specific resistance is about $1 \times 10^{-5}$ Ω·cm, and electrical conductivity at a level that is free from problems for practical use is exhibited. When the full width at half maximum is between 0.5 and 0.6, the specific resistance takes the minimum value (about $4 \times 10^{-6}$ Ω·cm), and when the ratio of the full width at half maximum is above 0.9, the specific resistance increases again to a value of above about $1 \times 10^{-5}$ Ω·cm. Thus, it is understood that electrical conductivity is deteriorated.

Therefore, it is construed in the characteristic curve shown in FIG. 4, predetermined electrical conductivity is stably obtained by adjusting the predetermined full width at half maximum to a value within the range of 0.3 to 0.9.

(5)-4 Initial Crystal Characteristics

Furthermore, the present invention is characterized by defining the crystal transformation characteristics for silver particles before and after a sintering treatment, and preferred crystal characteristics for silver particles before a sintering treatment, that is, preferred initial crystal characteristics, will be described below.

That is, it is preferable to adjust the integrated intensity of the peak at $2\theta=38°\pm0.2°$ for silver particles before a sintering treatment to a value within the range of 4,500 to 7,500 cps·°.

The reasons for this is that if such integrated intensity has a value of below 4,500 cps·°, electrical conductivity after a sintering treatment is decreased, and the specific resistance may be excessively increased. On the other hand, it is because if such integrated intensity has a value of above 7,500 cps·°, durable thermal conductivity after a sintering treatment may be excessively decreased.

Therefore, it is more preferable to adjust the integrated intensity of the peak at $2\theta=38°\pm0.2°$ for silver particles before a sintering treatment to a value within the range of 5,000 to 7,000 cps·°, and even more preferably to a value within the range of 5,500 to 6,500 cps·°.

Furthermore, it is preferable to adjust the peak height of the peak at $2\theta=38°\pm0.2°$ for silver particles before a sintering treatment to a value within the range of 6,000 to 38,000 cps.

The reason for this is that if such peak height has a value of below 6,000 cps, the electrical conductivity after a sintering treatment is decreased, and the specific resistance may be excessively increased. On the other hand, it is because if such peak height has a value of above 38,000 cps, durable thermal conductivity after a sintering treatment may be excessively decreased.

Therefore, it is more preferable to adjust the peak height of the peak at $2\theta=38°\pm0.2°$ for silver particles before a sintering treatment to a value within the range of 8,000 to 35,000 cps, and even more preferably to a value within the range of 10,000 to 32,000 cps.

Furthermore, when the peak height of the peak at $2\theta=38°\pm0.2°$ for silver particles before a sintering treatment is designated as $L1_{38}$, and the peak height of the peak at $2\theta=44°\pm0.2°$ is designated as $L1_{44}$, it is preferable to adjust the value of $L1_{44}/L1_{38}$ to a value within the range of above 0.2 but 0.5 or less.

The reason for this is that when such peak height ratio has a value of 0.2 or less, electrical conductivity after a sintering treatment is decreased, and the specific resistance may be excessively increased. On the other hand, it is because even if such peak height ratio has a value of above 0.5, electrical conductivity after a sintering treatment is decreased, and the specific resistance may be excessively increased.

Therefore, when the peak height of the peak at $2\theta=38°\pm0.2°$ for silver particles before a sintering treatment is designated as $L1_{38}$, and the peak height of the peak at $2\theta=44°\pm0.2°$ is designated as $L1_{44}$, it is even more preferable to adjust the value of $L1_{44}/L1_{38}$ to a value within the range of above 0.3 but 0.4 or less.

2. Dispersing Medium (1) Kind

Furthermore, the kind of the dispersing medium for making a paste is also not particularly limited, but the dispersing medium is preferably at least one compound selected from the group consisting of a glycol ether-based compound, a glycol ester-based compound, a hydrocarbon-based compound, and a polar solvent.

The reason for this is that with such a dispersing medium, appropriate viscosity can be imparted to the conductive paste while sinterability of the silver particles in the conductive paste is maintained more stably.

First, examples of the glycol ether-based compound include ethylene glycol, diethylene glycol, triethylene glycol, propylene glycol, dipropylene glycol, tripropylene glycol, butanediol, ethylene glycol monopropyl ether, ethylene glycol monoisopropyl ether, ethylene glycol monobutyl ether, ethylene glycol monoisobutyl ether, ethylene glycol monohexyl ether, diethylene glycol monomethyl ether, diethylene glycol monoethyl ether, diethylene glycol monopropyl ether, diethylene glycol monoisopropyl ether, diethylene glycol monobutyl ether, diethylene glycol monoisobutyl ether, diethylene glycol monohexyl ether, triethylene glycol monomethyl ether, triethylene glycol monoethyl ether, triethylene glycol monopropyl ether, triethylene glycol monoisopropyl ether, triethylene glycol monobutyl ether, triethylene glycol monoisobutyl ether, triethylene glycol monohexyl ether, propylene glycol monomethyl ether, propylene glycol monoethyl ether, propylene glycol monopropyl ether, propylene glycol monoisopropyl ether, propylene glycol monobutyl ether, propylene glycol monoisobutyl ether, propylene glycol monohexyl ether, dipropylene glycol monomethyl ether, dipropylene glycol monoethyl ether, dipropylene glycol monopropyl ether, dipropylene glycol monoisopropyl ether, dipropylene glycol monobutyl ether, dipropylene glycol monoisobutyl ether, dipropylene glycol monohexyl ether, tripropylene glycol monomethyl ether, tripropylene glycol monoethyl ether, tripropylene glycol monopropyl ether, tripropylene glycol monoisopropyl ether, tripropylene glycol monobutyl ether, tripropylene glycol monoisobutyl ether, tripropylene glycol monohexyl ether, tripropylene glycol monomethyl ether, tripropylene glycol monoethyl ether, tripropylene glycol monopropyl ether, tripropylene glycol monoisopropyl ether, tripropylene glycol monobutyl ether, tripropylene glycol monoisobutyl ether, tripropylene glycol monohexyl ether, diethylene glycol dimethyl ether, diethylene glycol diethyl ether, triethylene glycol dimethyl ether, triethylene glycol diethyl ether, propylene glycol dimethyl ether, propylene glycol diethyl ether, dipropylene glycol dimethyl ether, dipropylene glycol diethyl ether, 3-methoxybutanol, and 3-methoxy-3-methyl-1-butanol, which may be used singly or in combination of two or more kinds thereof.

Furthermore, examples of the glycol ester-based compound include methoxybutyl acetate, ethylene glycol monomethyl ether acetate, ethylene glycol monoethyl ether acetate, diethylene glycol monomethyl ether acetate, diethylene glycol monoethyl ether acetate, diethylene glycol monopropyl ether acetate, diethylene glycol monobutyl ether acetate, diethylene glycol monomethyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, dipropylene glycol monobutyl ether acetate, 3-methoxy-3-methyl-1-butyl acetate, and 3-methoxybutyl acetate, which may be used singly or in combination of two or more kinds thereof.

Furthermore, examples of the hydrocarbon-based compound include aliphatic hydrocarbons, aromatic hydrocarbons, and naphthene-based hydrocarbons, which may be used singly or in combination of two or more kinds thereof.

Furthermore, examples of the polar solvent include N-methylpyrrolidone, γ-butyrolactone, dimethyl sulfoxide, ethylene carbonate, propylene carbonate, and 1,3-dimethyl-2-imidazolidinone, which may be used singly or in combination of two or more kinds thereof.

(2) Amount of Incorporation

Furthermore, the amount of incorporation of the dispersing medium is preferably adjusted to a value within the range of 5 to 30 parts by weight relative to 100 parts by weight of the silver particles.

The reason for this is that when the amount of incorporation of the dispersing medium is adjusted as such, appropriate viscosity can be imparted to the conductive paste while sinterability of the silver particles in the conductive paste is stably maintained.

That is, it is because if the amount of incorporation of the dispersing medium has a value of below 5 parts by weight, since the amount of liquid components is small, forming a paste may be difficult. On the other hand, it is because if the amount of incorporation of the dispersing medium has a value of above 30 parts by weight, it may be difficult to remove the dispersing medium at the time of a sintering treatment, and the specific resistance may be excessively increased.

Therefore, it is more preferable to adjust the amount of incorporation of the dispersing medium to a value within the range of 6 to 20 parts by weight, and even more preferably to a value within the range of 7 to 10 parts by weight, relative to 100 parts by weight of the silver particles.

3. Organic Compound

On the occasion of configuring the conductive paste of the present invention, it is also preferable to incorporate an organic compound.

The reason for this is that when an organic compound is incorporated, stability over time of the sintered silver particles can be enhanced while sinterability of the silver particles in the conductive paste is stably maintained.

(1) Kind

The kind of the organic compound for regulating the sinterability of the silver particles is not particularly limited, but for example, one kind or a combination of two or more kinds selected from the group consisting of thermosetting resins such as an epoxy-based resin, a phenolic resin, a polyimide-based resin, an acrylic resin, a urethane-based resin, a silicone-based resin, an unsaturated polyester-based resin, a vinyl ester-based resin, a melamine-based resin, and a urea-based resin; nitrogen-containing compounds such as polyvinylpyrrolidone, triethanolamine, and choline; and organic acids such as ascorbic acid, myristic acid, and glutaric acid, may be used.

Among these, a thermosetting epoxy-based resin or phenolic resin is a more preferred organic compound.

The reason for this is that when such a thermosetting organic compound is used, stability over time of the sintered silver particles can be further enhanced while sinterability of the silver particles in the conductive paste is more stably maintained.

(2) Amount of Incorporation

Furthermore, the amount is incorporation of the organic compound is preferably set to a value within the range of 0.5 to 10 parts by weight relative to 100 parts by weight of the silver particles.

The reason for this is that when the amount of incorporation of the organic compound is adjusted as such, stability over time of the sintered silver particles can be further enhanced while sinterability of the silver particles in the conductive paste is stably maintained.

That is, it is because if the amount of incorporation of the organic compound has a value of below 0.5 parts by weight, the durable thermal conductivity after a sintering treatment may be excessively decreased. On the other hand, it is because if the amount of incorporation of the organic compound has a value of above 10 parts by weight, electrical conductivity after a sintering treatment is decreased, and the specific resistance may be excessively increased.

Therefore, it is more preferable to adjust the amount of incorporation of the organic compound to a value within the range of 1 to 8 parts by weight, and more preferably to a value within the range of 2 to 5 parts by weight, relative to 100 parts by weight of the silver particles.

Here, the relationship between the incorporation of the organic compound and the durable thermal conductivity will be explained using FIG. 5.

Figure 5:
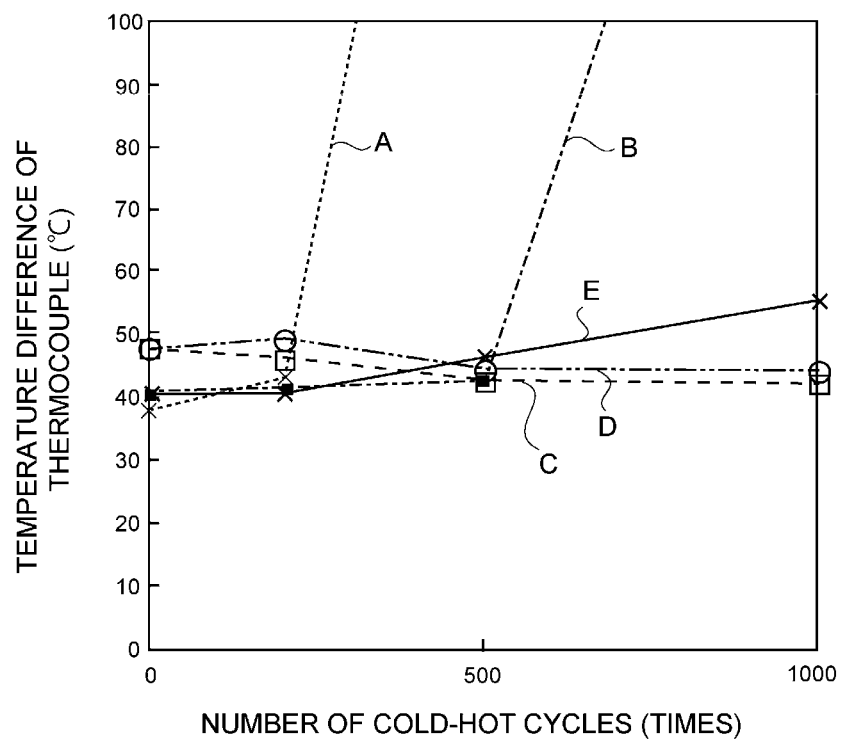
FIG. 5 is a diagram provided to explain the relationship between the incorporation of an organic compound and the durable thermal conductivity.

That is, FIG. 5 shows characteristic curves in which the horizontal axis represents the number (times) of hot-cold cycles when the durable thermal conductivity of a sintered conductive paste is evaluated, and the vertical axis represents the temperature difference (° C.) when the temperature of the thermocouple that sandwiches a measurement sample containing the sintered conductive paste, has reached an equilibrium.

More specifically, the respective characteristic curves obtained in a case of not incorporating an organic compound (characteristic curve A), in a case of incorporating an epoxy resin in an amount of 1 part by weight (characteristic curve B), in a case of incorporating an epoxy resin in an amount of 2 parts by weight (characteristic curve C), in a case of incorporating the a phenolic resin in an amount of 2 parts by weight (characteristic curve D), and in a case of incorporating a polyimide resin in an amount of 2 parts by weight (characteristic curve E), all relative to 100 parts by weight of the silver particles, are shown.

Meanwhile, the temperature difference on the vertical axis means that as the temperature difference has a smaller value, the durable thermal conductivity of the sintered conductive paste is superior.

Furthermore, a specific evaluation method for such durable thermal conductivity will be described in Examples.

First, it is construed that in the case of not incorporating an organic compound (characteristic curve A), predetermined thermal conductivity can be maintained to the time point where the number of hot-cold cycles is 200 times; however, at the time point at which the number of hot-cold cycles is 500 times, thermal conductivity is completely lost due to the generation of cracks and the like in the sintered silver particles.

On the other hand, it is understood that in the case of incorporating an epoxy resin in an amount of 1 part by weight (characteristic curve B), predetermined thermal conductivity can be maintained to the time point where the number of hot-cold cycles is 500 times, and the durable thermal conductivity is dramatically enhanced.

However, in this case, it is understood that at the time point at which the number of thermal cycles is 1,000 times, thermal conductivity is completely lost.

At this point, it is understood that in the case of incorporating an epoxy resin in an amount of 2 parts by weight (characteristic curve C) and in the case of incorporating a phenolic resin in an amount of 2 parts by weight (characteristic curve D), predetermined thermal conductivity can be maintained to the time point at which the number of cold-hot cycles is 1,000 times, and the durable thermal conductivity is dramatically enhanced.

Furthermore, it is understood that in the case of incorporating a polyimide resin in an amount of 2 parts by weight (characteristic curve E), thermal conductivity can be maintained to the time point at which the number of cold-hot cycles is 1,000 times; however, thermal conductivity is gradually deteriorated because the sintered silver particles are slowly deteriorated.

Therefore, in the characteristic curves shown in FIG. 5, it is construed that on the occasion of obtaining excellent durable thermal conductivity, it is preferable to use an epoxy resin and a phenolic resin as organic compounds, and it is preferable to adjust the amount of incorporation thereof to a value within the range of 0.5 to 10 parts by weight relative to 100 parts by weight of silver particles.

Furthermore, the relationship between the incorporation of an organic compound and the specific resistance will be explained using FIG. 6.

Figure 6:
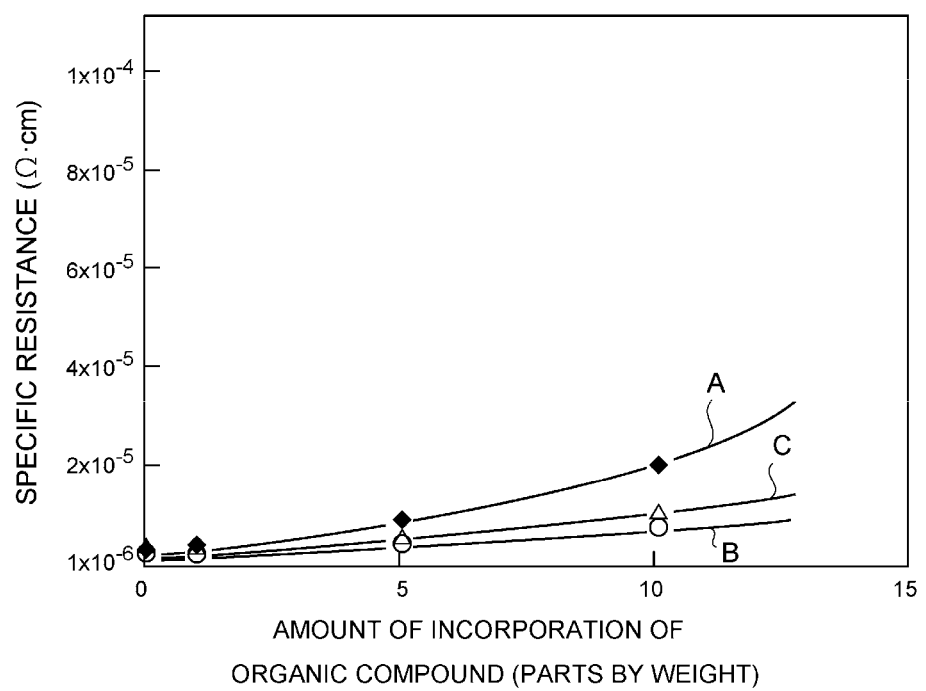
FIG. 6 is a diagram provided to explain the relationship between the incorporation of an organic compound and the specific resistance.

That is, FIG. 6 shows characteristic curves in which the horizontal axis represents the amount of incorporation (parts by weight) of the organic compound relative to 100 parts by weight of silver particles, and the vertical axis represents the specific resistance ($\Omega \cdot cm$) for the conductive paste after a sintering treatment.

More specifically, FIG. 6 shows characteristic curves in the cases of using an epoxy resin (characteristic curve A), an epoxy-novolac resin (one kind of epoxy resin) (characteristic curve B), and a phenolic resin (characteristic curve C) as the organic compounds.

As can be seen from these characteristic curves, it is construed that when an epoxy resin and a phenolic resin are used, even when one of the resins is incorporated in an amount of 10 parts by weight relative to 100 parts by weight of silver particles, the increase of the specific resistance can be suppressed to about $2 \times 10^{-5}$ $\Omega \cdot cm$ or less, and when the resin is incorporated in an amount of 2 parts by weight, the organic compound hardly contributes to the increase of the specific resistance compared with the case of not incorporating the organic compound.

4. Additives

It is also preferable to add various additives, for example, an oxidation inhibitor, an ultraviolet absorber, a metal ion scavenger, a viscosity adjusting agent, an inorganic filler, an organic filler, carbon fibers, a colorant, and a coupling agent, into the conductive paste.

Particularly, in a conductive paste, since oxidative deterioration is usually accelerated due to the addition of silver particles, it is preferable to add an amine-based oxidation inhibitor, a phenolic oxidation inhibitor, a phosphoric acid ester-based oxidation inhibitor, or the like as an oxidation inhibitor in an amount within the range of 0.1% to 10% by weight relative to the total amount.

Furthermore, it is preferable to add silica particles to the conductive paste, and any of hydrophobic silica or hydrophilic silica can be suitably incorporated.

Also, it is preferable to set the amount of addition of such silica particles to a value within the range of 0.1% to 5% by weight relative to the total amount.

The reason for this is that if the amount of addition of such silica particles has a value of below 0.1% by weight, the effect of addition may not be manifested. On the other hand, it is because if the amount of addition of such silica particles has a value of above 5% by weight, electrical conductivity and thermal conductivity may be excessively decreased.

Therefore, it is more preferable to set the amount of addition of such silica particles to a value within the range of 0.2% to 3% by weight, and more preferably to a value within the range of 0.5% to 2% by weigh, relative to the total amount.

5. Viscosity

Furthermore, it is preferable to adjust the viscosity (measurement temperature: 25° C.) of the conductive paste to a value within the range of 1,000 to 300,000 mPa·sec.

The reason for this is that if the viscosity of such conductive paste has a value of below 1,000 mPa·sec, the silver particles are prone to sediment, or electrical conductivity and thermal conductivity may be noticeably decreased. On the other hand, the viscosity of such conductive paste is above 300,000 mPa·sec, handling may be difficult, or uniform application may be difficult.

Therefore, it is more preferable to adjust the viscosity (measurement temperature: 25° C.) of the conductive paste to a value within the range of 3,000 to 100,000 mPa·sec, and even more preferably to a value within the range of 10,000 to 80,000 mPa·sec.

6. Density

Furthermore, it is preferable to adjust the density of the conductive paste to a value within the range of 1.4 to 7 g/cm$^3$.

The reason for this is that if the density of such conductive paste has a value of below 1.4 g/cm$^3$, electrical conductivity and thermal conductivity may be noticeably decreased.

On the other hand, it is because if the density of such conductive paste is above 7 g/cm$^3$, handleability may be decreased, or the conductive paste may be easily detached from the adherend.

Therefore, it is more preferable to adjust the density of the conductive paste to a value within the range of 3 to 6.5 g/cm$^3$, and even more preferably to a value within the range of 4 to 6 g/cm$^3$.

7. Production Method

The method for producing the conductive paste is not particularly limited, but for example, it is preferable to produce the conductive paste by mixing and dispersing a predetermined amount of silver particles in an organic compound and a dispersing medium by utilizing a propeller mixer, a planetary mixer, a three-roll, a kneader, a spatula or the like.

Then, it is preferable that these components are uniformly mixed, and then aggregates of silver particles, contaminants, and the like are eliminated by performing a filtration treatment using a filter or the like.

The reason for this is that when aggregates of silver particles and the like are filtered, clogging can be effectively prevented when the conductive paste is applied using a dispenser or the like.

Meanwhile, when silver particles are used, there is an advantage that since the silver particles have cavities in the interior and also have a predetermined surface treatment applied thereon, aggregates are generated to a reduced extent and can be easily filtered using, for example, a mesh filter having a mesh size of 20 to 200 μm, or the like.

Second Exemplary Embodiment

The second exemplary embodiment relates to a die bonding method characterized by including a step of applying, at a predetermined site on a substrate for mounting a semiconductor device, a conductive paste which contains silver particles having a volume average particle size of 0.1 to 30 μm as a sinterable conductive material, and a dispersing medium for making a paste-like form, and in which when the integrated intensity of the peak at 2θ 38°±0.2° in the X-ray diffraction chart obtainable by an XRD analysis before a sintering treatment of the silver particles is designated as S1, and the integrated intensity of the peak at 2θ=38°±0.2° in the X-ray diffraction chart obtainable by an XRD analysis after a sintering treatment (250° C., 60 minutes) of the silver particles is designated as S2, the value of S2/S1 is adjusted to a value within the range of 0.2 to 0.8; and a step of heating the conductive paste under the temperature conditions of 200° C. to 450° C. to sinter the silver particles, and thereby mounting a semiconductor device on the substrate.

Hereinafter, the die bonding method using the conductive paste of the second exemplary embodiment will be specifically explained, separately for the respective constituent elements.

1. First Step
(1) Conductive Paste

The conductive paste can be described by the same matters explained in the first exemplary embodiment, and therefore, further explanation thereon will not be repeated here.

(2) Semiconductor Device/Substrate

The adherend on which the conductive paste is applied is a substrate on which a circuit for mounting a semiconductor device has been formed.

Therefore, more specifically, examples of the adherend include a ceramic substrate, a glass substrate, an epoxy resin substrate, a paper/phenol substrate and the like, on which circuits have been formed.

However, there are occasions in which the conductive paste is applied on the semiconductor device side, depending on the use.

(3) Coating Conditions

Furthermore, there are no particular limitations on the coating conditions; however, it is preferable to apply the conductive paste using screen printing, inkjet printing, dispenser printing, spin coat printing or the like, usually to a thickness within the range of 1 to 500 μm, more preferably to a thickness within the range of 10 to 300 μm, and even more preferably to a thickness within the range of 30 to 200 tuft.

2. Second Step
(1) Heating Temperature

The present invention is characterized in that the heating temperature for the second step is set to a value within the range of 200° C. to 450° C.

The reason for this is that if such heating temperature has a value of below 200° C., sinterability of the silver particles is noticeably decreased.

On the other hand, it is because if such heating temperature is above 450° C., the silver particles are excessively sintered, and cracks are prone to be generated.

Therefore, it is more preferable to set the heating temperature for the second step to a value within the range of 230° C. to 430° C., and even more preferably to a value within the range of 250° C. to 400° C.

Meanwhile, although there are no particular limitations on the heating apparatus for maintaining such heating temperature, it is preferable to use a hot air circulating oven, an infrared heating apparatus, an inert gas heating apparatus, a reflow apparatus, or the like.

(2) Heating Time

Furthermore, the heating time for the second step may vary with the heating temperature, but usually, it is preferable to set the heating time to a value within the range of 10 to 180 minutes.

The reason for this is that if such heating time has a value of below 10 minutes, sinterability of the silver particles may be noticeably decreased.

On the other hand, it is because if such heating time is above 180 minutes, the production efficiency may be excessively decreased, or the silver particles may be excessively sintered so that cracks are prone to be generated.

Therefore, it is preferable to set the heating time for the second step to a value within the range of 20 to 120 minutes, and even more preferably to a value within the range of 30 to 60 minutes.

(3) Pressure Conditions

In addition, upon the implementation of the second step, the semiconductor device may be connected with the substrate, with the conductive paste inserted therebetween, in a non-pressurized state, that is, by means of the weight of the semiconductor device itself. However, usually, it is preferable to set the pressure conditions to a value within the range of 5 to 80 kgf/cm$^2$.

The reason for this is that if such pressure conditions have a value of below 5 kgf/cm$^2$, sinterability of the silver particles may be noticeably decreased. On the other hand, if such pressure conditions have a value of above 80 kgf/cm$^2$, the semiconductor device may be damaged, or the silver particles may be excessively sintered, so that cracks are prone to be generated.

Therefore, it is preferable to set the pressure conditions for the second step to a value within the range of 10 to 50 kgf/cm$^2$, and even more preferably to a value within the range of 20 to 40 kgf/cm$^2$.

EXAMPLES

Hereinafter, the conductive paste of the present invention and the like will be described in more detail by referring to Examples.

Example 1

1. Production of Silver Particles

Silver particles were produced by a liquid phase reduction method.

That is, 12 g of silver nitrate was dissolved in 1 kg of ion-exchanged water, and 40 g of 25% aqueous ammonia was added thereto. Thus, an aqueous solution of an ammine salt of silver was obtained.

Thereafter, 1.7 g of sodium hydroxide was added to the aqueous solution of an ammine salt of silver thus obtained and was dissolved therein. Subsequently, 60 g of 37% formalin was added thereto with stirring, and thus silver particles were precipitated.

Next, the silver particles thus obtained were washed with water and filtered, and the silver particles were subjected to IPA substitution.

Thereafter, a surface treating agent prepared by dissolving 0.3 g of stearic acid in 10 g of IPA was added to the silver particles to conduct a surface treatment of the silver particles, and then the particles were subjected to vacuum drying at 100° C. Thus, spherical hollow silver particles having a volume average particle size of 1.9 μm were obtained.

The carbon content in the hollow silver particles thus obtained was 0.79% by weight relative to the total amount (100% by weight) of the hollow silver particles thus obtained.

2. Evaluation of Silver Particles
(1) XRD Analysis
(1)-1 Before Sintering Treatment An XRD analysis of the silver particles before a sintering treatment was carried out.

That is, the silver particles thus obtained were filled in a sample holder for an X-ray diffraction apparatus (manufactured by Rigaku Corp., RINT2500VHF), and measurement of the peak height, full width at half maximum and integrated intensity of the peak at 2θ=38°±0.2°, and the crystallite size was carried out under the conditions described below. The results thus obtained are presented in Table 1, and also an XRD spectrum chart thus obtained is presented in FIG. 1(a).

X-ray: Cu/40 kV/50 mA
Scan speed: 4 deg/min
Sampling width: 0.02 deg
Scan range: 20 to 90 deg
(1)-2 after Sintering Treatment An XRD analysis of the silver particles after a sintering treatment was carried out.

Furthermore, the silver particles thus obtained were screened on a glass plate surface through a 100-mesh sieve so as to prevent the silver particles from overlapping one another, and the silver particles were sintered by heating for 60 minutes in a circulating air dryer under the conditions of 250° C. Subsequently, the silver particles after the sintering treatment thus obtained were subjected to an XRD analysis under the same conditions as in the case of before the sintering treatment. The results thus obtained are presented in Table 1, and also, an XRD spectrum chart thus obtained is presented in FIG. 1(b).

Furthermore, based on the XRD analysis results before the sintering treatment and after the sintering treatment, the peak height ratio (L2/L1), the ratio of full width at half maximum (W2/W1), and the integrated intensity ratio (S2/S1) were calculated. The results thus obtained are presented in Table 1.

3. Production of Conductive Paste 100 parts by weight of the silver particles thus obtained and 10 parts by weight of dipropylene glycol monomethyl ether acetate (DPMA) as a dispersing medium were accommodated in a vessel attached to a stirring apparatus, and then the compounds were uniformly mixed using a stirring apparatus.

Next, the mixture was subjected to a filtration treatment using a filtering apparatus equipped with a mesh filter having a mesh size of 63 μm, and thus a conductive paste of Example 1 was obtained.

4. Evaluation of Conductive Paste
(1) Sinterability

That is, the conductive paste thus obtained was applied on a silver-plated copper substrate having a size of 8 mm×12 mm×2 mm to a thickness of 25 μm, and then a silver-plated silicon semiconductor device having a size of 3 mm×4 mm×0.4 mm was mounted thereon.

Thereafter, the assembly was heated in a breeze oven under the conditions of no added pressure and a temperature of 250° C. for one hour to sinter the conductive paste, and then the assembly was cooled to room temperature. This was used as a measurement sample.

Next, a cut cross-section of the sintered product thus obtained was observed with a microscope, and sinterability thereof was evaluated according to the criteria described below. The results thus obtained are presented in Table 1.

⊙: The silver particles were uniformly sintered together, and there was no unsintered part observed.

○: The silver particles were almost uniformly sintered together, and there was almost no unsintered part observed.

Δ: The silver particles were partially sintered together, but unsintered parts were conspicuous.

X: The silver particles were not sintered together, and most of the conductive paste was constituted of unsintered parts.

(2) Specific Resistance (Electrical Conductivity)

Electrical conductivity of the conductive paste thus obtained was evaluated.

That is, the conductive paste thus obtained was printed in the form of lines which measured 50 mm×1 mm×0.1 mm on a preparation glass plate, and the assembly was heated in a breeze oven under the conditions of no added pressure and 250° C. for one hour to sinter the conductive paste. Thus, this was used as a measurement sample.

Next, the resistance value (number of measurements: 3) between two points (20 mm) was measured by a four-terminal method (measurement current: 0.1 mA) using a tester for four-terminals, and the average value was calculated. Also, an evaluation of the specific resistance was carried out according to the criteria described below. The results thus obtained are presented in Table 1.

⊙: The average value of specific resistance was a value of below $5\times10^{-6}$ Ω·cm.

○: The average value of specific resistance was a value of $5\times10^{-6}$ Ω·cm or more and below $5\times10^{-5}$ Ω·cm.

Δ: The average value of specific resistance was a value of $5\times10^{-5}$ Ω·cm or more and below $5\times10^{-3}$ Ω·cm.

X: The average value of specific resistance was a value of $5\times10^{-3}$ Ω·cm or more.

Example 2

Figure 7A:
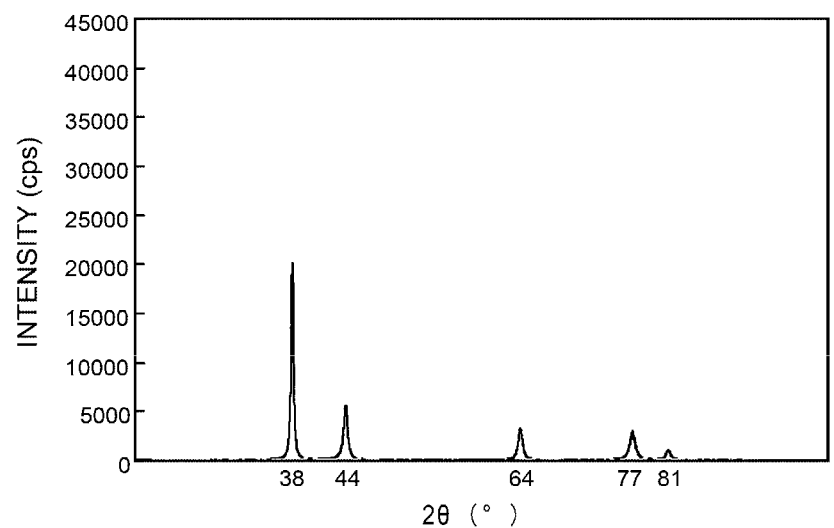
FIGS. 7(a) and 7(b) are XRD spectrum charts of silver particles in Example 2.
Figure 7B:
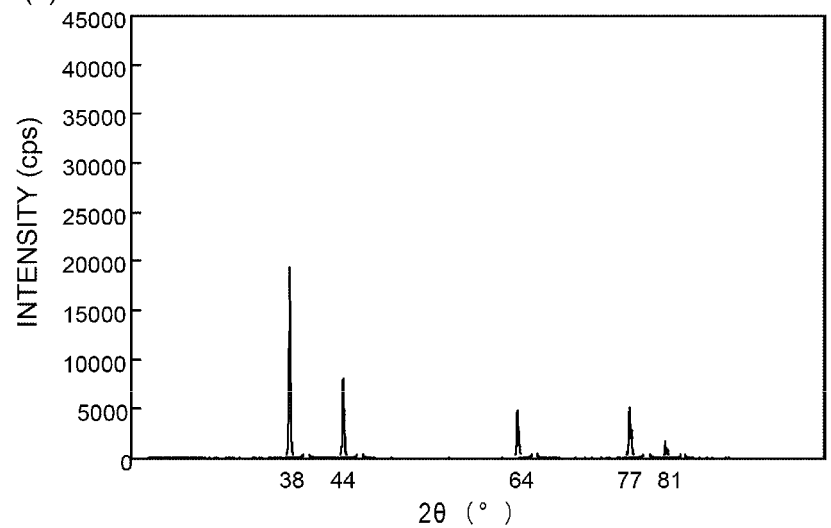

In Example 2, silver particles and a conductive paste were produced in the same manner as in Example 1, except that spherical hollow silver particles having a volume average particle size of 2.3 μm were obtained by regulating the conditions at the time of producing silver particles by a liquid phase reduction method, and the silver particles and the conductive paste were evaluated. The results thus obtained are presented in Table 1, and also, the XRD spectrum charts of the silver particles obtained before a sintering treatment and after a sintering treatment are presented in FIGS. 7(a) and 7(b), respectively.

Example 3

Figure 8A:
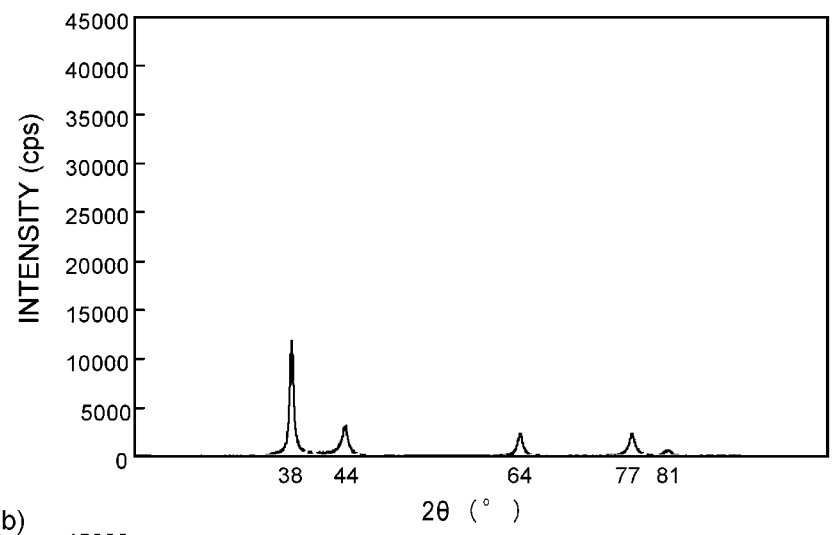
FIGS. 8(a) and 8(b) are XRD spectrum charts of silver particles in Example 3.
Figure 8B:
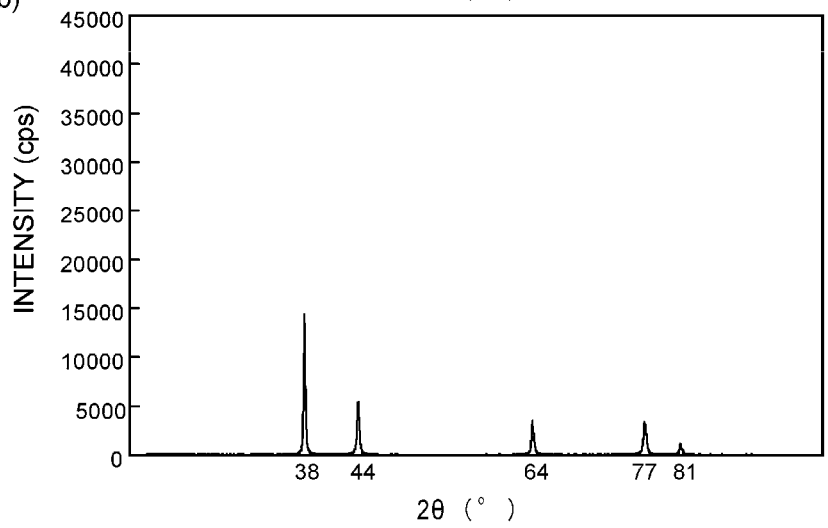

In Example 3, silver particles and a conductive paste were produced in the same manner as in Example 1, except that spherical hollow silver particles having a volume average particle size of 1.6 μm were obtained by regulating the conditions at the time of producing silver particles by a liquid phase reduction method, and the silver particles and the conductive paste were evaluated. The results thus obtained are presented in Table 1, and also, the XRD spectrum charts of the silver particles obtained before a sintering treatment and after a sintering treatment are presented in FIGS. 8(a) and 8(b), respectively.

Meanwhile, the carbon content in the hollow silver particles thus obtained was 0.82% by weight relative to the total amount (100% by weight) of the hollow silver particles thus obtained.

Example 4

Figure 9A:
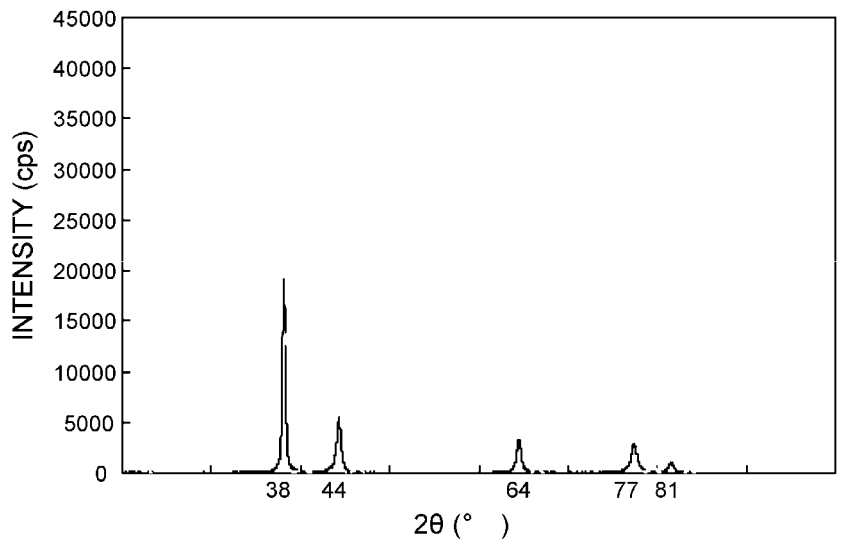
FIGS. 9(a) and 9(b) are XRD spectrum charts of silver particles in Example 4.
Figure 9B:
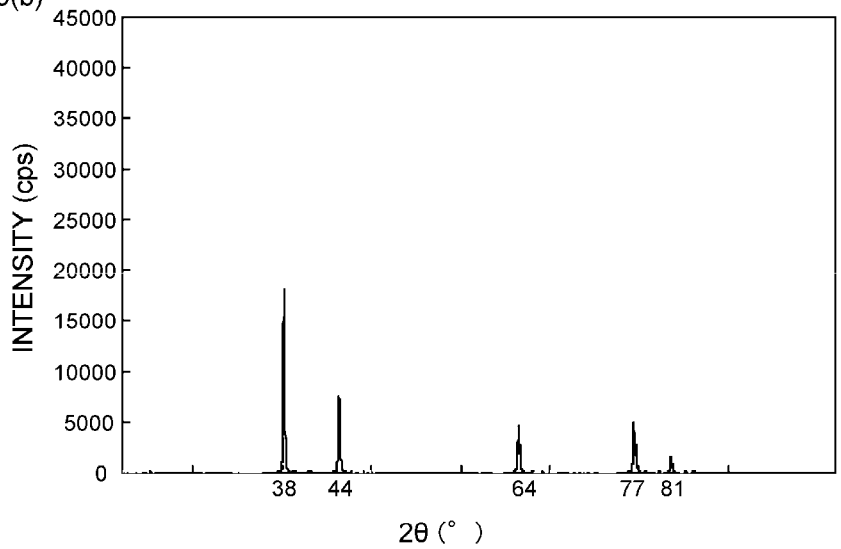

In Example 4, silver particles and a conductive paste were produced in the same manner as in Example 1, except that spherical hollow silver particles having a volume average particle size of 2.4 μm were obtained by regulating the conditions at the time of producing silver particles by a liquid phase reduction method, and the silver particles and the conductive paste were evaluated. The results thus obtained are presented in Table 1, and also, the XRD spectrum charts of the silver particles obtained before a sintering treatment and after a sintering treatment are presented in FIGS. 9(a) and 9(b), respectively.

Example 5

Figure 10A:
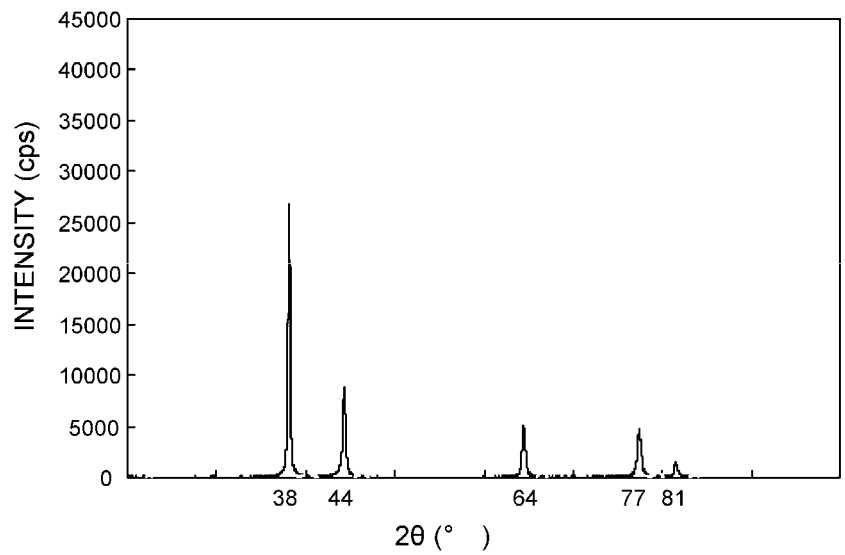
FIGS. 10(a) and 10(b) are XRD spectrum charts of silver particles in Example 5.
Figure 10B:
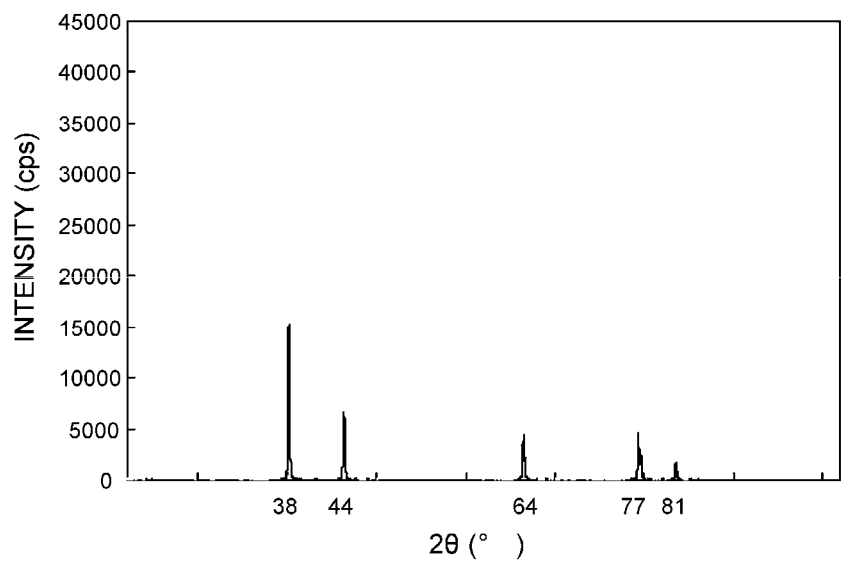

In Example 5, silver particles and a conductive paste were produced in the same manner as in Example 1, except that spherical hollow silver particles having a volume average particle size of 3.8 μm were obtained by regulating the conditions at the time of producing silver particles by a liquid phase reduction method, and the silver particles and the conductive paste were evaluated. The results thus obtained are presented in Table 1, and also, the XRD spectrum charts of the silver particles obtained before a sintering treatment and after a sintering treatment are presented in FIGS. 10(a) and 10(b), respectively.

Example 6

Figure 11A:
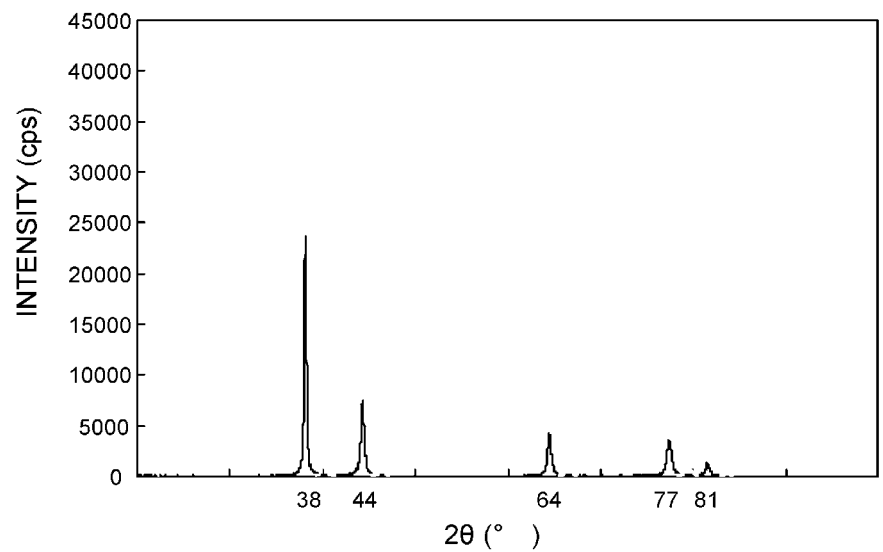
FIGS. 11(a) and 11(b) are XRD spectrum charts of silver particles in Example 6.
Figure 11B:
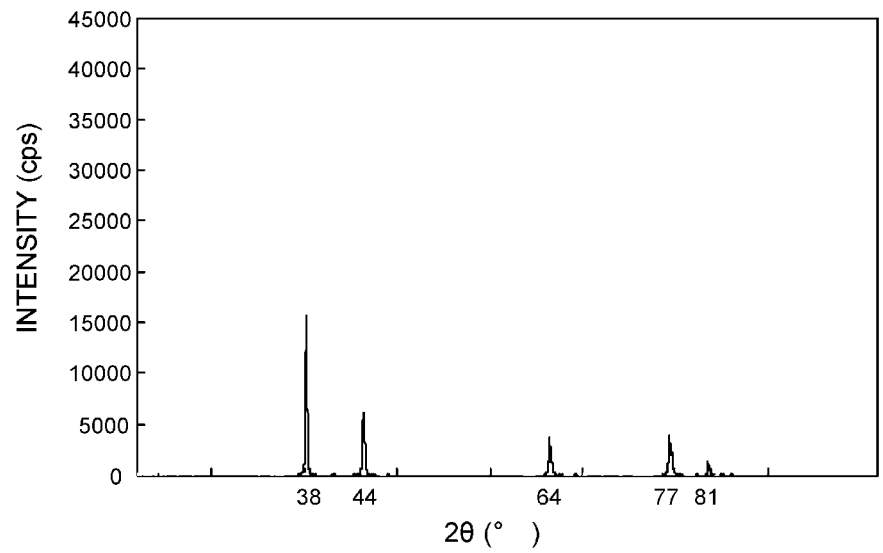

In Example 6, silver particles and a conductive paste were produced in the same manner as in Example 1, except that spherical hollow silver particles having a volume average particle size of 5.4 μm were obtained by regulating the conditions at the time of producing silver particles by a liquid phase reduction method, and the silver particles and the conductive paste were evaluated. The results thus obtained are presented in Table 1, and also, the XRD spectrum charts of the silver particles obtained before a sintering treatment and after a sintering treatment are presented in FIGS. 11(a) and 11(b), respectively.

Example 7

Figure 12A:
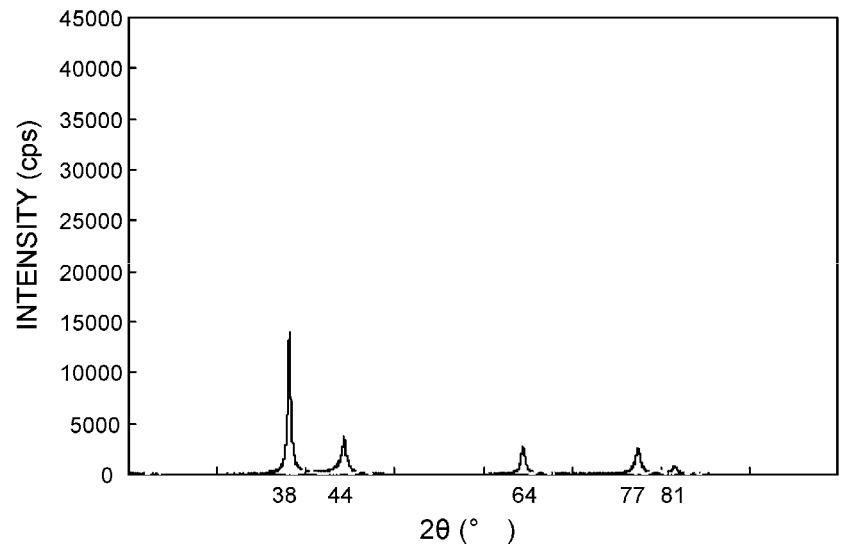
FIGS. 12(a) and 12(b) are XRD spectrum charts of silver particles in Example 7.
Figure 12B:
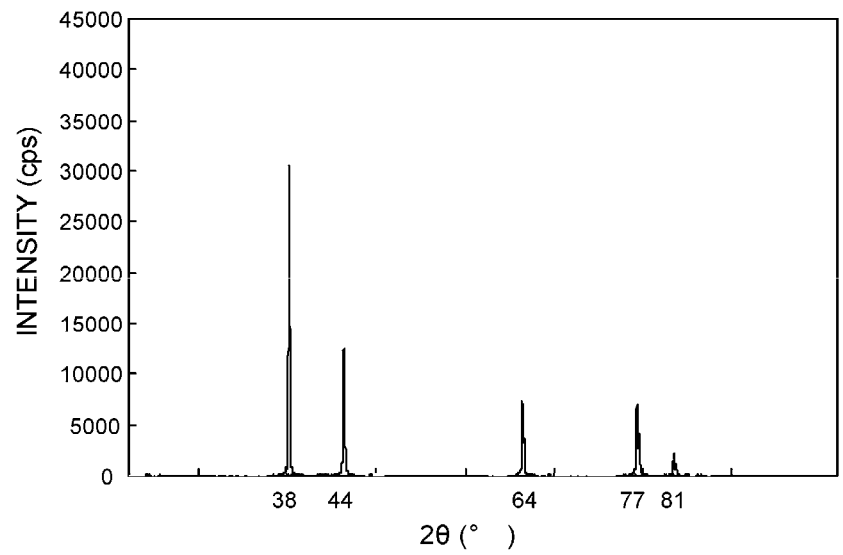

In Example 7, silver particles and a conductive paste were produced in the same manner as in Example 1, except that spherical hollow silver particles having a volume average particle size of 3.0 μm were obtained by regulating the conditions at the time of producing silver particles by a liquid phase reduction method, and the silver particles and the conductive paste were evaluated. The results thus obtained are presented in Table 1, and also, the XRD spectrum charts of the silver particles obtained before a sintering treatment and after a sintering treatment are presented in FIGS. 12(a) and 12(b), respectively.

Example 8

Figure 13A:
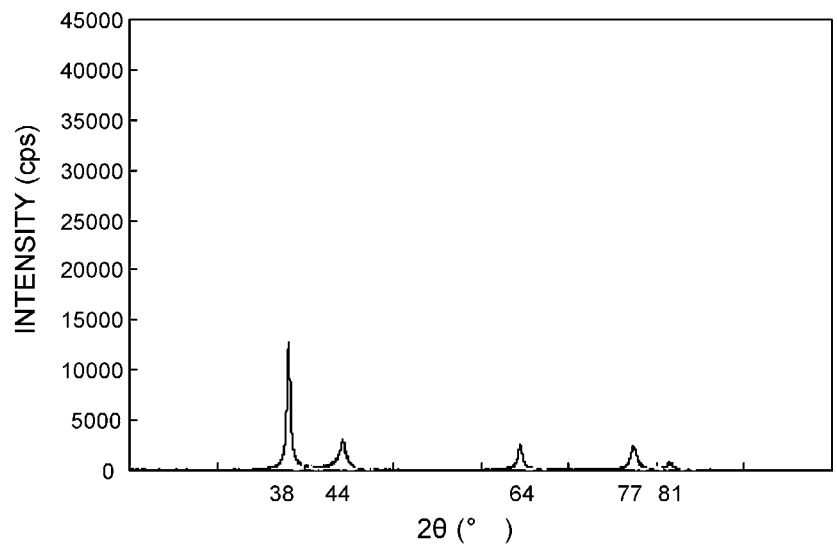
FIGS. 13(a) and 13(b) are XRD spectrum charts of silver particles in Example 8.
Figure 13B:
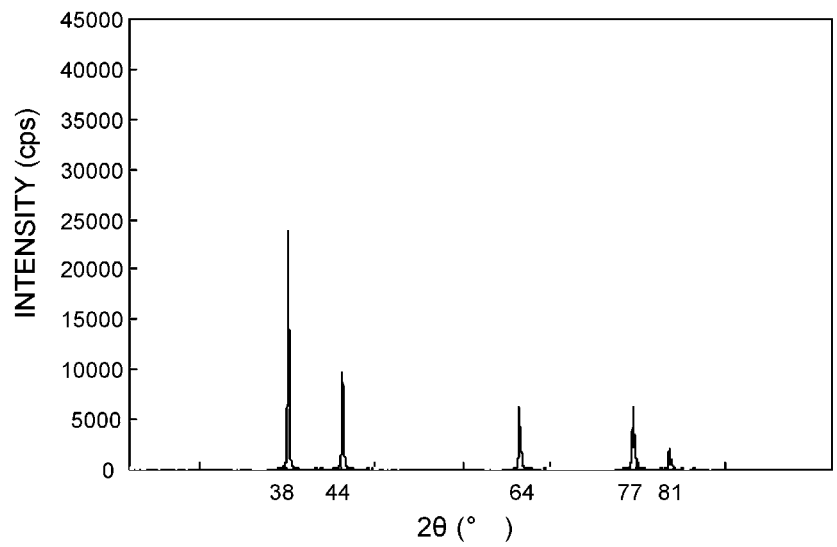

In Example 8, silver particles and a conductive paste were produced in the same manner as in Example 1, except that spherical hollow silver particles having a volume average particle size of 4.0 μm were obtained by regulating the conditions at the time of producing silver particles by a liquid phase reduction method, and the silver particles and the conductive paste were evaluated. The results thus obtained are presented in Table 1, and also, the XRD spectrum charts of the silver particles obtained before a sintering treatment and after a sintering treatment are presented in FIGS. 13(a) and 13(b), respectively.

Example 9

Figure 14A:
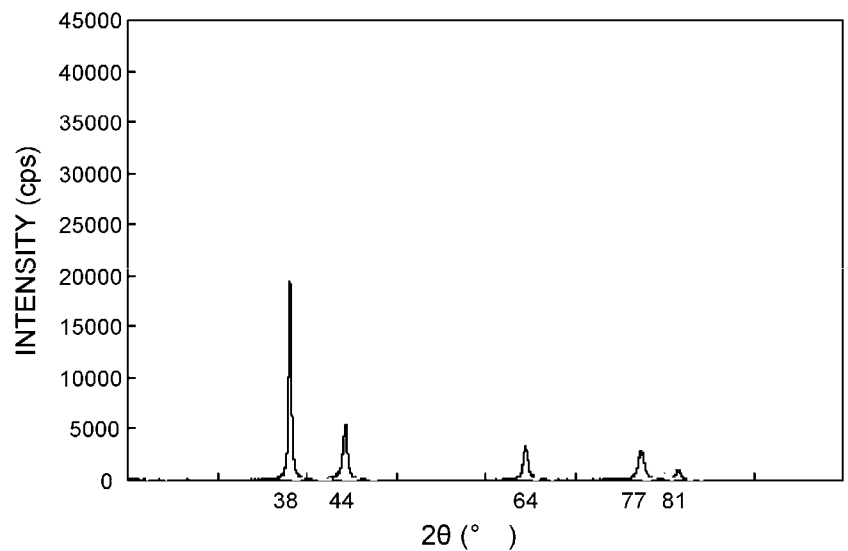
FIGS. 14(a) and 14(b) are XRD spectrum charts of silver particles in Example 9.
Figure 14B:
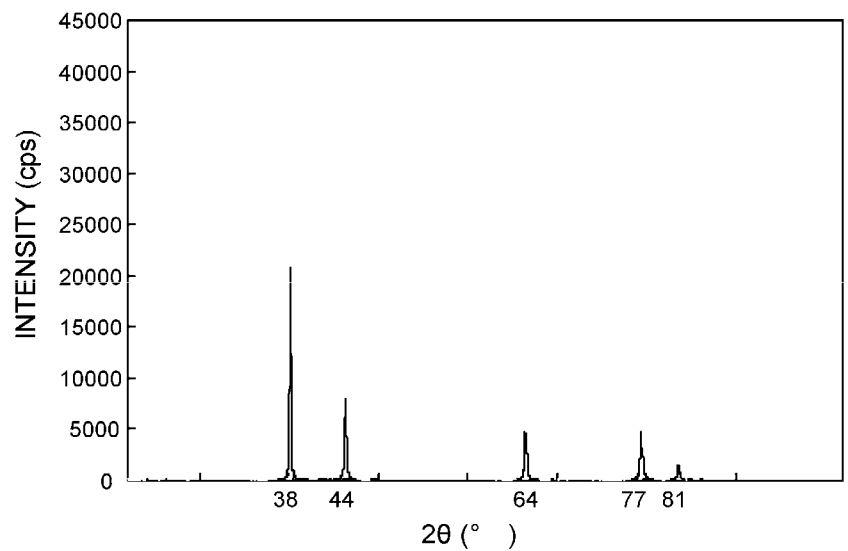

In Example 9, silver particles and a conductive paste were produced in the same manner as in Example 1, except that spherical hollow silver particles having a volume average particle size of 4.5 μm were obtained by regulating the conditions at the time of producing silver particles by a liquid phase reduction method, and the silver particles and the conductive paste were evaluated. The results thus obtained are presented in Table 1, and also, the XRD spectrum charts of the silver particles obtained before a sintering treatment and after a sintering treatment are presented in FIGS. 14(a) and 14(b), respectively.

Example 10

Figure 15A:
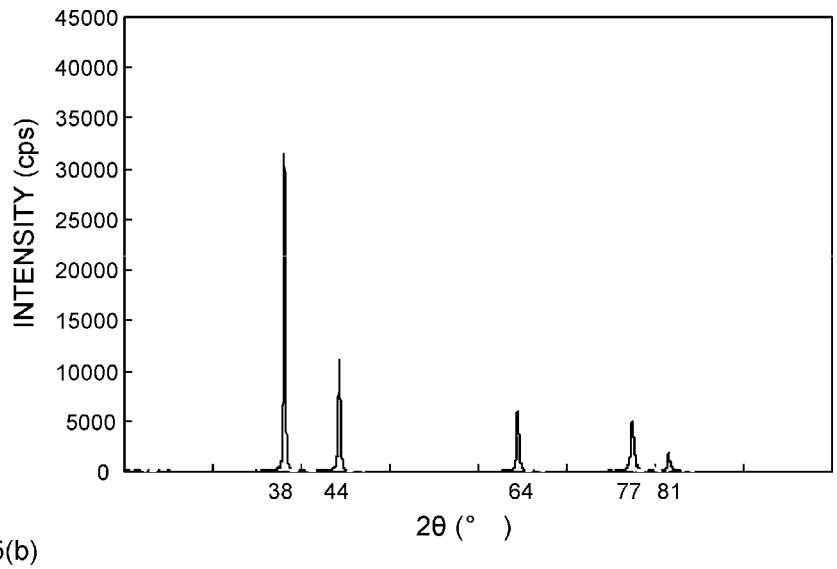
FIGS. 15(a) and 15(b) are XRD spectrum charts of silver particles in Example 10.
Figure 15B:
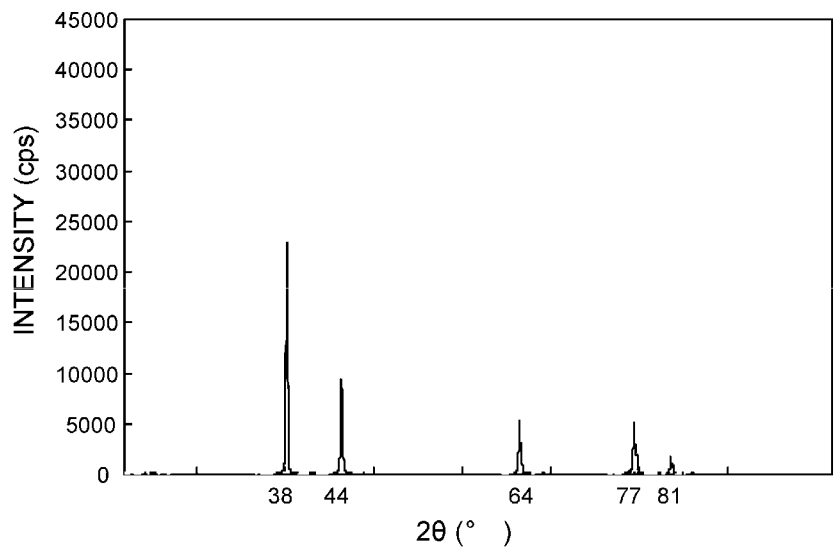

In Example 10, silver particles and a conductive paste were produced in the same manner as in Example 1, except that spherical hollow silver particles having a volume average particle size of 2.9 μm were obtained by regulating the conditions at the time of producing silver particles by a liquid phase reduction method, and the silver particles and the conductive paste were evaluated. The results thus obtained are presented in Table 1, and also, the XRD spectrum charts of the silver particles obtained before a sintering treatment and after a sintering treatment are presented in FIGS. 15(a) and 15(b), respectively.

Example 11

Figure 16A:
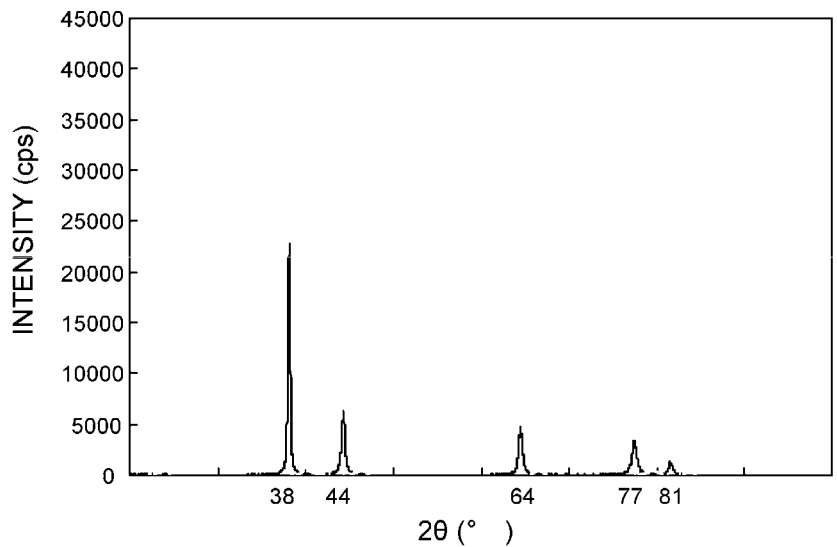
FIGS. 16(a) and 16(b) are XRD spectrum charts of silver particles in Example 11.
Figure 16B:
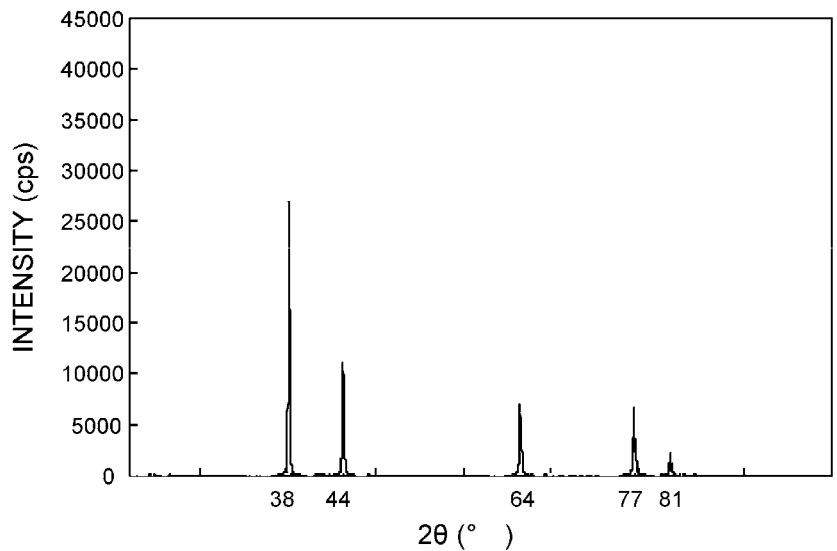

In Example 11, silver particles and a conductive paste were produced in the same manner as in Example 1, except that flake-shaped solid silver particles having a volume average particle size of 3.8 μm were obtained by regulating the conditions at the time of producing silver particles by a liquid phase reduction method, and the silver particles and the conductive paste were evaluated. The results thus obtained are presented in Table 1, and also, the XRD spectrum charts of the silver particles obtained before a sintering treatment and after a sintering treatment are presented in FIGS. 16(a) and 16(b), respectively.

Comparative Example 1

Figure 17A:
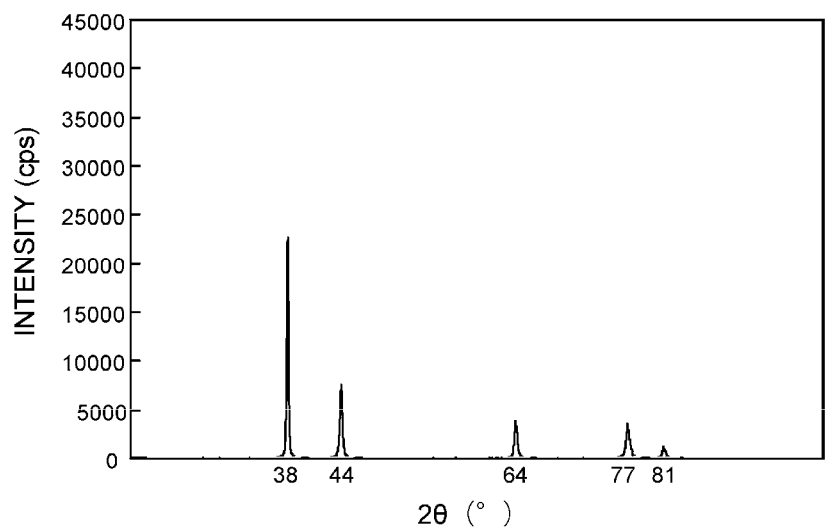
FIGS. 17(a) and 17(b) are XRD spectrum charts of silver particles in Comparative Example 1.
Figure 17B:
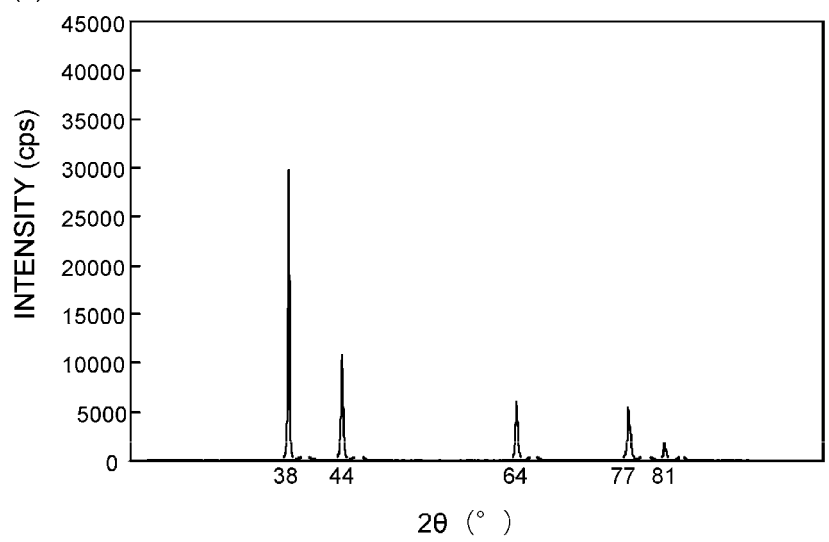

In Comparative Example 1, silver particles and a conductive paste were produced in the same manner as in Example 1, except that silver particles were produced by an atomization method, and thus spherical solid silver particles having a volume average particle size of 5.0 μm were obtained, and the silver particles and the conductive paste were evaluated. The results thus obtained are presented in Table 1, and also, the XRD spectrum charts of the silver particles obtained before a sintering treatment and after a sintering treatment are presented in FIGS. 17(a) and 17(b), respectively.

Meanwhile, regarding the atomization method, a water atomization method of producing silver particles by performing pulverization of molten metal and rapid solidification instantaneously using high pressure water (see JP 11-106804 A) was used.

Comparative Example 2

Figure 18A:
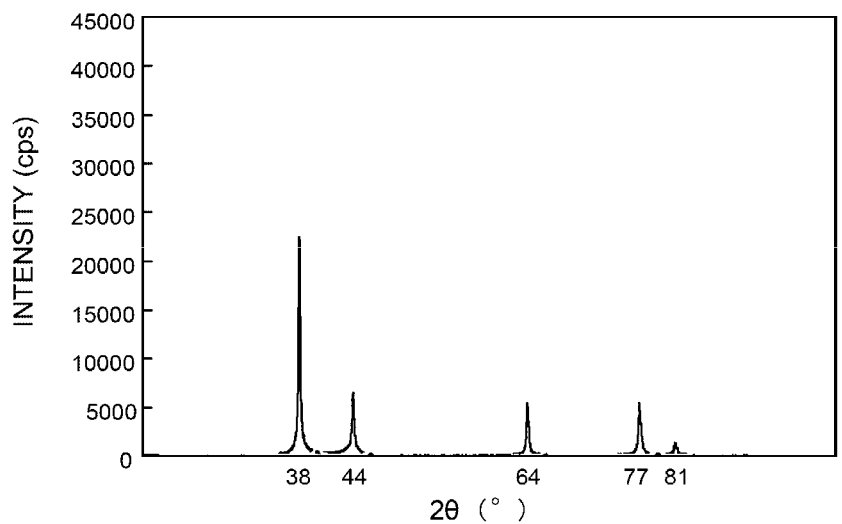
FIGS. 18(a) and 18(b) are XRD spectrum charts of silver particles in Comparative Example 2.
Figure 18B:
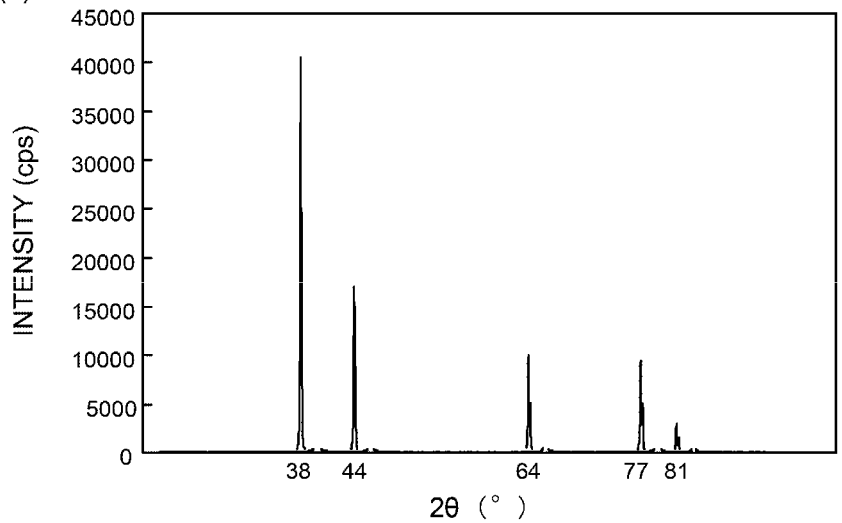

In Comparative Example 2, silver particles and a conductive paste were produced in the same manner as in Example 1, except that close-cropped hollow silver particles having a volume average particle size of 3.0 μm were obtained by regulating the conditions at the time of producing silver particles by a liquid phase reduction method, and the silver particles and the conductive paste were evaluated. The results thus obtained are presented in Table 1, and also, the XRD spectrum charts of the silver particles obtained before a sintering treatment and after a sintering treatment are presented in FIGS. 18(a) and 18(b), respectively.

Comparative Example 3

Figure 19A:
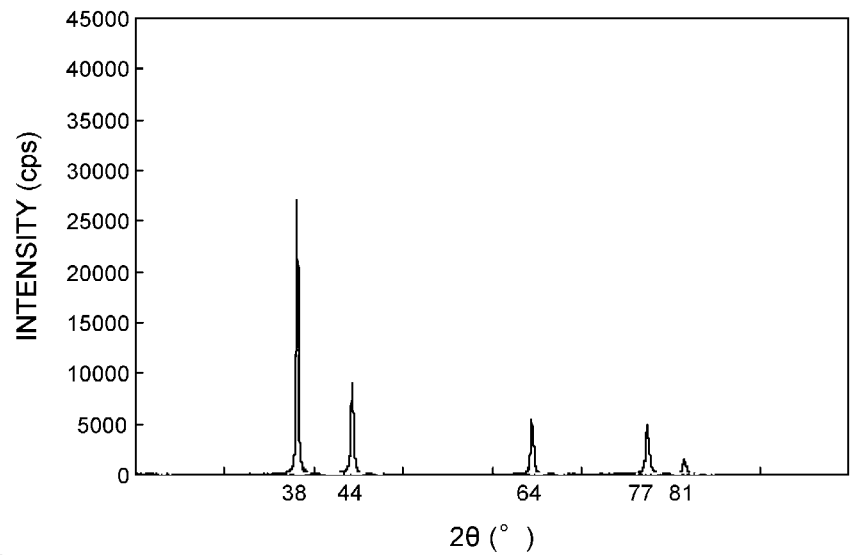
FIGS. 19(a) and 19(b) are XRD spectrum charts of silver particles in Comparative Example 3.
Figure 19B:
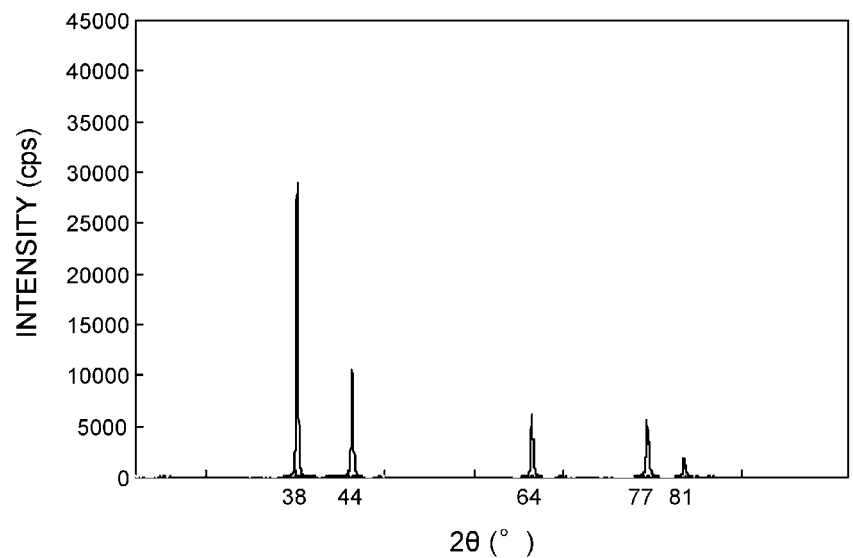

In Comparative Example 3, silver particles and a conductive paste were produced in the same manner as in Example 1, except that spherical solid silver particles having a volume average particle size of 1.8 μm were obtained by regulating the conditions at the time of producing silver particles by a liquid phase reduction method, and the silver particles and the conductive paste were evaluated. The results thus obtained are presented in Table 1, and also, the XRD spectrum charts of the silver particles obtained before a sintering treatment and after a sintering treatment are presented in FIGS. 19(a) and 19(b), respectively.

Comparative Example 4

Figure 20A:
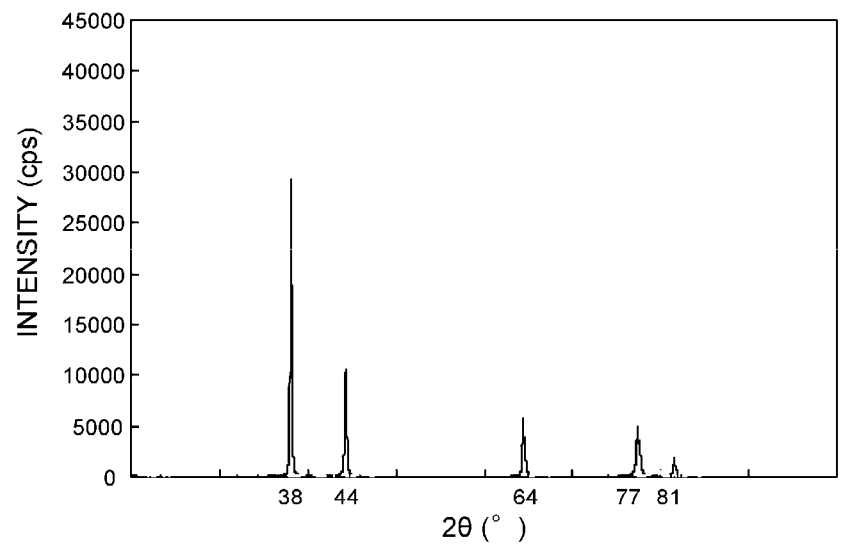
FIGS. 20(a) and 20(b) are XRD spectrum charts of silver particles in Comparative Example 4.
Figure 20B:
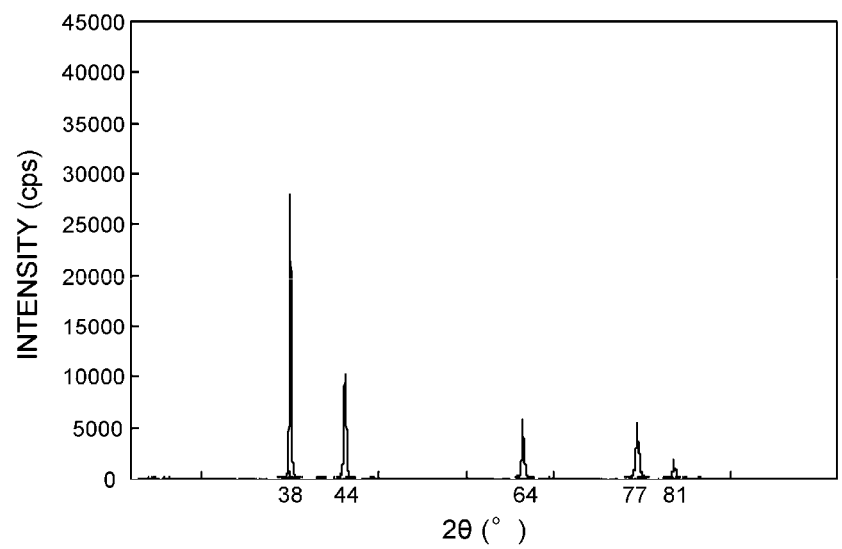

In Comparative Example 4, silver particles and a conductive paste were produced in the same manner as in Example 1, except that silver particles were produced by an atomization method, and thus spherical solid silver particles having a volume average particle size of 7.7 μm were obtained, and the silver particles and the conductive paste were evaluated. The results thus obtained are presented in Table 1, and also, the XRD spectrum charts of the silver particles obtained before a sintering treatment and after a sintering treatment are presented in FIGS. 20(a) and 20(b), respectively.

TABLE 1

| | | | | XRD characteristics | | | | | |
|---|---|---|---|---|---|---|---|---|---|
| | | | | Before sintering | | | | After sintering | |
| | Production method | Shape | Average particle size (μm) | Peak height (cps) | Full width at half maximum (°) | Integrated intensity (cps · °) | Crystallite size (Å) | Peak height (cps) | Full width at half maximum (°) |
| Example 1 | Reduction | Spherical | 1.9 | 20333 | 0.301 | 6126 | 292 | 15807 | 0.149 |
| Example 2 | Reduction | Spherical | 2.3 | 20107 | 0.302 | 6210 | 291 | 19383 | 0.139 |
| Example 3 | Reduction | Spherical | 1.6 | 11847 | 0.448 | 5909 | 196 | 14390 | 0.183 |
| Example 4 | Reduction | Spherical | 2.4 | 19207 | 0.314 | 6108 | 280 | 18080 | 0.133 |
| Example 5 | Reduction | Spherical | 3.8 | 26873 | 0.207 | 6440 | 424 | 15260 | 0.135 |
| Example 6 | Reduction | Spherical | 5.4 | 23727 | 0.232 | 6118 | 378 | 15627 | 0.156 |
| Example 7 | Reduction | Spherical | 3.0 | 13970 | 0.351 | 5672 | 250 | 30443 | 0.133 |
| Example 8 | Reduction | Spherical | 4.0 | 12893 | 0.416 | 6030 | 211 | 23847 | 0.132 |
| Example 9 | Reduction | Spherical | 4.5 | 19493 | 0.291 | 6088 | 301 | 20783 | 0.156 |
| Example 10 | Reduction | Spherical | 2.9 | 31423 | 0.172 | 5532 | 509 | 22887 | 0.150 |
| Example 11 | Reduction | Flake-shaped | 3.8 | 22827 | 0.268 | 5990 | 328 | 26890 | 0.136 |
| Comparative Example 1 | Atomization | Spherical | 5.0 | 22700 | 0.194 | 4411 | 452 | 29767 | 0.167 |
| Comparative Example 2 | Reduction | Close-cropped | 3.0 | 22453 | 0.203 | 5700 | 433 | 40497 | 0.126 |
| Comparative Example 3 | Reduction | Spherical | 1.8 | 27167 | 0.177 | 5685 | 497 | 29013 | 0.153 |
| Comparative Example 4 | Atomization | Spherical | 7.7 | 29387 | 0.154 | 4724 | 571 | 27997 | 0.152 |

| | XRD characteristics | | | | | Evaluation of conductive paste | | |
|---|---|---|---|---|---|---|---|---|
| | After sintering | | Peak height ratio (—) | Ratio of full width at half maximum (—) | Integrated intensity ratio (—) | Sinterability (—) | Electrical conductivity | |
| | Integrated intensity (cps · °) | Crystallite size (Å) | | | | | Specific resistance (Ω · cm) | Determination (—) |
| Example 1 | 2565 | 589 | 0.78 | 0.50 | 0.42 | ⊚ | 4.0 × 10⁻⁶ | ⊚ |
| Example 2 | 2913 | 630 | 0.96 | 0.46 | 0.47 | ○ | 7.3 × 10⁻⁶ | ○ |
| Example 3 | 2956 | 480 | 1.21 | 0.41 | 0.50 | ○ | 7.4 × 10⁻⁶ | ○ |
| Example 4 | 2598 | 662 | 0.94 | 0.42 | 0.43 | ○ | 7.2 × 10⁻⁶ | ○ |
| Example 5 | 2234 | 652 | 0.57 | 0.65 | 0.35 | ⊚ | 4.8 × 10⁻⁶ | ⊚ |
| Example 6 | 2555 | 564 | 0.66 | 0.67 | 0.42 | ⊚ | 4.7 × 10⁻⁶ | ⊚ |
| Example 7 | 4398 | 662 | 2.18 | 0.38 | 0.78 | ○ | 16.0 × 10⁻⁶ | ○ |
| Example 8 | 3461 | 666 | 1.85 | 0.32 | 0.57 | ○ | 13.2 × 10⁻⁶ | ○ |

TABLE 1-continued

| | | | | | | | | |
|---|---|---|---|---|---|---|---|---|
| Example 9 | 3547 | 564 | 1.07 | 0.54 | 0.58 | ◉ | $9.1 \times 10^{-6}$ | ◯ |
| Example 10 | 3399 | 587 | 0.73 | 0.87 | 0.61 | ◉ | $7.6 \times 10^{-6}$ | ◯ |
| Example 11 | 3928 | 644 | 1.18 | 0.51 | 0.66 | ◉ | $8.7 \times 10^{-6}$ | ◯ |
| Comparative Example 1 | 5057 | 526 | 1.31 | 0.86 | 1.15 | X | Not sintered | X |
| Comparative Example 2 | 5397 | 699 | 1.80 | 0.62 | 0.95 | Δ | $123.0 \times 10^{-6}$ | Δ |
| Comparative Example 3 | 4749 | 574 | 1.07 | 0.86 | 0.84 | Δ | $64.1 \times 10^{-6}$ | Δ |
| Comparative Example 4 | 4271 | 579 | 0.95 | 0.99 | 0.90 | X | Not sintered | X |

Example 12

1. Production of Conductive Paste

In Example 12, silver particles and a conductive paste were produced in the same manner as in Example 1, except that when the conductive paste was produced, 10 parts by weight of N-methylpyrrolidone (NMP) was incorporated as a dispersing medium instead of DPMA, relative to 100 parts by weight of the silver particles thus obtained.

2. Evaluation of Conductive Paste (1) Initial Thermal Conductivity

The initial thermal conductivity of the conductive paste thus obtained was evaluated.

That is, the conductive paste thus obtained was applied on a silver-plated copper substrate having a size of 8 mm×12 mm×2 mm to a thickness of 25 μm, and then a silver-plated silicon semiconductor device having a size of 3 mm×4 mm×0.4 mm was mounted thereon.

Subsequently, the assembly was heated in a breeze oven under the conditions of no added pressure and a temperature of 250° C. for one hour to sinter the conductive paste, and then the assembly was cooled to room temperature. This was used as the measurement sample.

Thereafter, both surfaces of the measurement sample thus obtained were sandwiched between copper chips for thermocouple fixation, and then the measurement sample was placed on a heat dissipation block such that the copper chips on the silver-plated copper substrate side would be on the lower side. A heater was provided on the copper chips on the silver-plated silicon semiconductor device side.

Next, the measurement sample was heated by operating the heater, and the temperature difference (number of measurements: 3) at the time when the temperature difference between the upper wire and the lower wire of a thermocouple reached an equilibrium, was measured. The average value of the temperature difference was calculated, and also, the temperature difference was evaluated according to the criteria described below. The results thus obtained are presented in Table 2.

◉: The temperature difference at the time of equilibrium in the thermocouples had a value of below 50° C.

◯: The temperature difference at the time of equilibrium in the thermocouples had a value of 50° C. or higher but below 55° C.

Δ: The temperature difference at the time of equilibrium in the thermocouples had a value of 55° C. or higher but below 60° C.

X: The temperature difference at the time of equilibrium in the thermocouples had a value of 60° C. or higher.

(2) Durable Thermal Conductivity

The durable thermal conductivity of the conductive paste thus obtained was evaluated.

That is, a measurement sample obtained in the same manner as in the case of the evaluation of the initial thermal conductivity was subjected to cold-hot cycles of cooling under the conditions of no added pressure and a temperature of −55° C. for 15 minutes, and then heating under the conditions of no added pressure and a temperature of 150° C. for 15 minutes in a breeze oven. The measurement sample was taken out after every 200 cycles, 500 cycles, and 1,000 cycles, and the temperature difference at the time of equilibrium in the thermocouples was measured and evaluated. The results thus obtained are presented in Table 2.

Example 13

In Example 13, silver particles and a conductive paste were produced in the same manner as in Example 12, except that when the conductive paste was produced, 9 parts by weight of DPMA as a dispersing medium, 1.0 parts by weight fan epoxy resin (manufactured by Adeka Corp., Ep 49-25) as an organic compound, and 0.1 parts by weight of a curing agent (manufactured by Shikoku Chemicals Corp., C17Z) were incorporated relative to 100 parts by weight of the silver particles thus obtained, and the silver particles and the conductive paste were evaluated. The results thus obtained are presented in Table 2.

Example 14

In Example 14, silver particles and a conductive paste were produced in the same manner as in Example 12, except that when the conductive paste was produced, 8 parts by weight of DPMA as a dispersing medium, 2.0 parts by weight of an epoxy resin (manufactured by Adeka Corp., Ep 49-25) as an organic compound, and 0.2 parts by weight of a curing agent (manufactured by Shikoku Chemicals Corp., C17Z) were incorporated relative to 100 parts by weight of the silver particles thus obtained, and the silver particles and the conductive paste were evaluated. The results thus obtained are presented in Table 2.

Example 15

In Example 15, silver particles and a conductive paste were produced in the same manner as in Example 12, except that when the conductive paste was produced, 5.6 parts by weight of DPMA as a dispersing medium, and 2.0 parts by weight of a phenolic resin (manufactured by Gunei Chemical Industry Co., Ltd., RESITOP PL-5208) as an organic compound were incorporated relative to 100 parts by weight of the silver particles thus obtained, and the silver particles and the conductive paste were evaluated. The results thus obtained are presented in Table 2.

Example 16

In Example 16, silver particles and a conductive paste were produced in the same manner as in Example 12, except that when the conductive paste was produced, 8.1 parts by weight of NMP as a dispersing medium, 2.0 parts by weight of a polyimide resin (manufactured by Maruzen Petrochemical Co., Ltd., BANI-X) as an organic compound, and 0.1 parts by weight of an epoxy resin (manufactured by DIC Corp., EPICLON 7050) as an additive were incorporated relative to 100 parts by weight of the silver particles thus obtained, and the silver particles and the conductive paste were evaluated. The results thus obtained are presented in Table 2.

TABLE 2

| | Silver particles (parts by weight) | Organic resin | | | Dispersing medium | | Temperature difference at time of equilibrium of thermocouple(° C.) | | | |
|---|---|---|---|---|---|---|---|---|---|---|
| | | Epoxy resin (parts by weight) | Phenolic resin (parts by weight) | Polyimide resin (parts by weight) | NMP (parts by weight) | DPMA (parts by weight) | Cold-hot cycle 0 times | Cold-hot cycle 200 times | Cold-hot cycle 500 times | Cold-hot cycle 1,000 times |
| Example 12 | 100 | — | — | — | 10 | — | 37.9 | 43 | Rupture | Rupture |
| Example 13 | 100 | 1 | — | — | — | 9 | 40.9 | 41.5 | 42.5 | Rupture |
| Example 14 | 100 | 2 | — | — | — | 8 | 47.6 | 46.1 | 42.7 | 42 |
| Example 15 | 100 | — | 2 | — | — | 5.6 | 47.5 | 49.1 | 44.4 | 44.1 |
| Example 16 | 100 | — | — | 2 | 8.1 | — | 40.3 | 40.5 | 46.4 | 55.2 |

INDUSTRIAL APPLICABILITY

As discussed above, when the conductive paste of the present invention is used, since silver particles having a predetermined particle size and having predetermined crystal transformation characteristics defined by an XRD analysis are used as a sinterable conductive material, and the conductive paste includes a dispersing medium for making a paste-like form, sinterability of the silver particles can be easily controlled without depending on the crystallinity of the silver particles before a sintering treatment, and after a sintering treatment, excellent electrical conductivity and thermal conductivity can be stably obtained.

Therefore, since the conductive paste of the present invention can be suitably used particularly as a material for die bonding that is used in heat dissipation bonding between a semiconductor device and a substrate, the conductive paste is expected to be widely used as a substitute for high temperature solder.

The invention claimed is:

1. A conductive paste comprising silver particles having a volume average particle size of 0.1 to 30 μm as a sinterable conductive material, and a dispersing medium for making a paste,
    wherein when the integrated intensity of the peak at $2\theta=38°\pm0.2°$ in the X-ray diffraction chart obtainable by an XRD analysis before a sintering treatment of the silver particles is designated as S1, and
    the integrated intensity of the peak at $2\theta=38°\pm0.2°$ in the X-ray diffraction chart obtainable by an XRD analysis after a sintering treatment, at 250° C. for 60 minutes, of the silver particles is designated as S2,
    the value of S2/S1 is adjusted to a value within the range of 0.2 to 0.8, and
    the amount of incorporation of the dispersing medium is adjusted to a value within the range of 5 to 30 parts by weight relative to 100 parts by weight of the silver particles.

2. The conductive paste according to claim 1, wherein when the peak height of the peak at $2\theta=38°\pm0.2°$ in the X-ray diffraction chart obtainable by an XRD analysis before a sintering treatment of the silver particles is designated as L1, and
    the peak height of the peak at $2\theta=38°\pm0.2°$ in the X-ray diffraction chart obtainable by an XRD analysis after a sintering treatment, at 250° C. for 60 minutes, of the silver particles is designated as L2,
    the value of L2/L1 is adjusted to a value within the range of 0.5 to 1.5.

3. The conductive paste according to claim 1, wherein when the full width at half maximum of the peak at $2\theta=38°\pm0.2°$ in the X-ray diffraction chart obtainable by an XRD analysis before a sintering treatment of the silver particles is designated as W1, and
    the full width at half maximum of the peak at $2\theta=38°\pm0.2°$ in the X-ray diffraction chart obtainable by the analysis after a sintering treatment, at 250° C. for 60 minutes, of the silver particles is designated as W2,
    the value of W2/W1 is adjusted to a value within the range of 0.3 to 0.9.

4. The conductive paste according to claim 1, wherein the silver particles are hollow silver particles.

5. The conductive paste according to claim 1, wherein the surface of the silver particles is covered by at least one organic surface treating agent selected from an organic acid, an organic acid salt, a surfactant, and a coupling agent.

6. The conductive paste according to claim 1, wherein the dispersing medium is at least one compound selected from the group consisting of a glycol ether-based compound, a glycol ester-based compound, a hydrocarbon-based compound, and a polar solvent.

7. The conductive paste according to claim 1, wherein the conductive paste further comprises an organic compound, and the amount of incorporation of the organic compound is adjusted to a value within the range of 0.5 to 10 parts by weight relative to 100 parts by weight of the silver particles.

8. The conductive paste according to claim 7, wherein the organic compound is a thermosetting resin including at least one of an epoxy resin and a phenolic resin.

* * * * *